(12) United States Patent
Masunaga et al.

(10) Patent No.: US 11,380,764 B2
(45) Date of Patent: Jul. 5, 2022

(54) SEMICONDUCTOR DEVICE, METHOD OF MANUFACTURING SAME, AND SENSOR

(71) Applicant: HITACHI, LTD., Tokyo (JP)

(72) Inventors: Masahiro Masunaga, Tokyo (JP); Shintaroh Sato, Tokyo (JP); Akio Shima, Tokyo (JP); Digh Hisamoto, Tokyo (JP)

(73) Assignee: HITACHI, LTD., Tokyo (JP)

( * ) Notice: Subject to any disclaimer, the term of this patent is extended or adjusted under 35 U.S.C. 154(b) by 699 days.

(21) Appl. No.: 16/462,319

(22) PCT Filed: Oct. 24, 2017

(86) PCT No.: PCT/JP2017/038383
§ 371 (c)(1),
(2) Date: May 20, 2019

(87) PCT Pub. No.: WO2018/110093
PCT Pub. Date: Jun. 21, 2018

(65) Prior Publication Data
US 2019/0319103 A1    Oct. 17, 2019

(30) Foreign Application Priority Data
Dec. 14, 2016  (JP) .............. JP2016-242662

(51) Int. Cl.
*H01L 29/16*    (2006.01)
*H01L 21/02*    (2006.01)
(Continued)

(52) U.S. Cl.
CPC .... *H01L 29/1608* (2013.01); *H01L 21/02378* (2013.01); *H01L 21/02529* (2013.01);
(Continued)

(58) Field of Classification Search
CPC ............. H01L 21/02; H01L 21/02378; H01L 21/02529; H01L 21/02634; H01L 21/82;
(Continued)

(56) References Cited

U.S. PATENT DOCUMENTS 6,344,663 B1    2/2002   Slater, Jr. et al.
2001/0038129 A1  11/2001  Omi et al.
(Continued)

FOREIGN PATENT DOCUMENTS

JP    H10-098371 A    4/1998
JP    2000508477 A    7/2000
(Continued)

OTHER PUBLICATIONS

Taiwanese Search Report for Taiwan Application No. 106142878.

*Primary Examiner* — Fazli Erdem
(74) *Attorney, Agent, or Firm* — Miles & Stockbridge P.C.

(57) ABSTRACT

The purpose of the present invention is to provide a semiconductor device comprising an epitaxial layer formed on a SiC substrate, and a CMOS formed in the top part of the epitaxial layer, wherein growth of any defects present at the interface between the SiC substrate and the epitaxial layer is suppressed, and the reliability of the semiconductor device is improved. As a means to achieve the foregoing, a semiconductor device is formed such that the distance from a p-type diffusion layer to the interface between an n-type epitaxial layer and an n-type semiconductor substrate is larger than the thickness of a depletion layer that extends from the p-type diffusion layer to the back side of the n-type semiconductor substrate in response to the potential difference between a substrate electrode and another substrate electrode.

12 Claims, 14 Drawing Sheets

(51) Int. Cl.

| | | |
|---|---|---|
| *H01L 23/49* | (2006.01) | |
| *H01L 27/02* | (2006.01) | |
| *H01L 21/82* | (2006.01) | |
| *H01L 23/498* | (2006.01) | |
| *H01L 23/00* | (2006.01) | |
| *H01L 27/092* | (2006.01) | |
| *H01L 29/08* | (2006.01) | |
| *H01L 29/10* | (2006.01) | |
| *H01L 29/36* | (2006.01) | |
| *H01L 29/417* | (2006.01) | |
| *H01L 29/66* | (2006.01) | |

(52) U.S. Cl.
CPC .... *H01L 21/02634* (2013.01); *H01L 21/8213* (2013.01); *H01L 23/49838* (2013.01); *H01L 24/32* (2013.01); *H01L 27/0207* (2013.01); *H01L 27/0922* (2013.01); *H01L 29/0847* (2013.01); *H01L 29/1095* (2013.01); *H01L 29/36* (2013.01); *H01L 29/41758* (2013.01); *H01L 29/66068* (2013.01); *H01L 2224/32225* (2013.01)

(58) Field of Classification Search
CPC . H01L 21/8213; H01L 29/08; H01L 29/0847; H01L 29/10; H01L 29/1095; H01L 29/16; H01L 29/1608; H01L 29/41; H01L 29/41758; H01L 29/36; H01L 29/66; H01L 29/66068; H01L 24/32; H01L 23/49; H01L 23/49838; H01L 27/02; H01L 27/0207; H01L 27/09; H01L 27/0922

USPC .......................................................... 257/349
See application file for complete search history.

(56) References Cited

U.S. PATENT DOCUMENTS

| | | |
|---|---|---|
| 2004/0077164 A1 | 4/2004 | Kornegay et al. |
| 2011/0198612 A1 | 8/2011 | Malhan |
| 2018/0277636 A1* | 9/2018 | Kiyosawa ......... H01L 29/66068 |
| 2020/0006066 A1* | 1/2020 | Konishi ................. H01L 29/06 |

FOREIGN PATENT DOCUMENTS

| | | |
|---|---|---|
| JP | 2002009283 A | 1/2002 |
| JP | 2005519778 A | 7/2005 |
| JP | 2014203991 A | 10/2014 |

* cited by examiner

[FIG. 1]
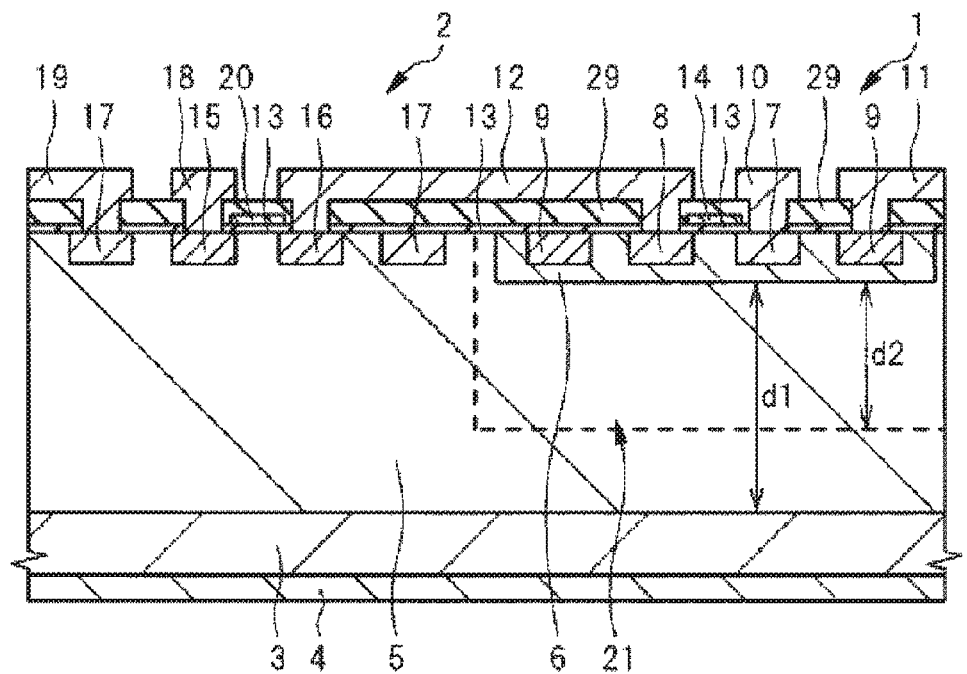
[FIG. 2]
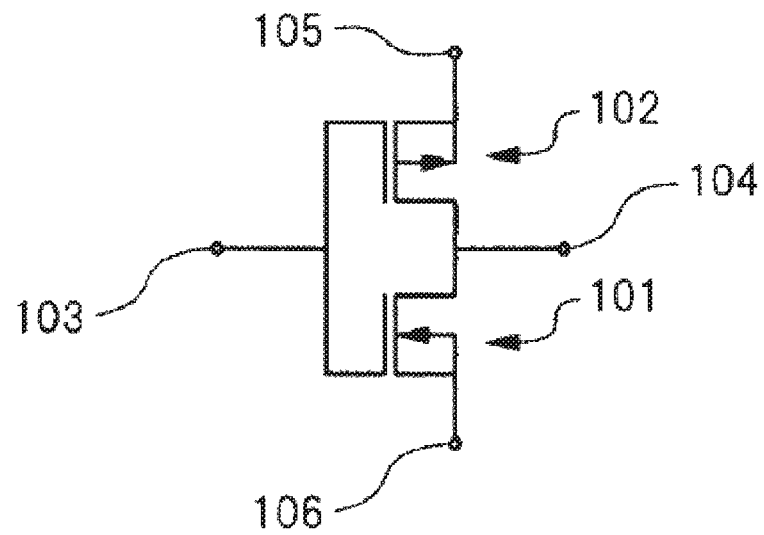

[FIG. 3]
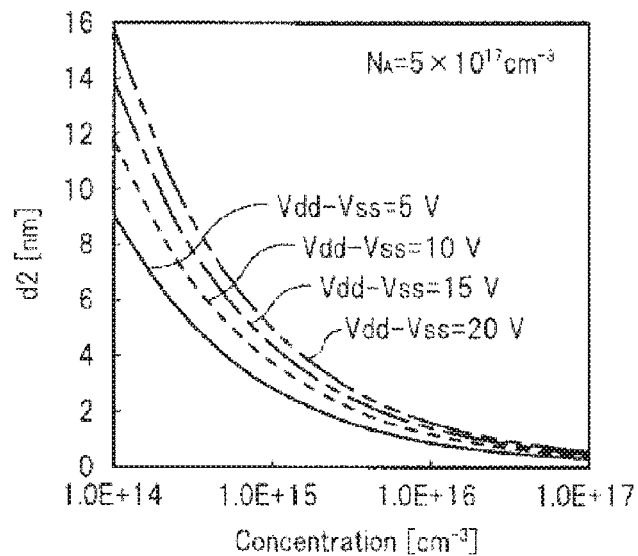
[FIG. 4]
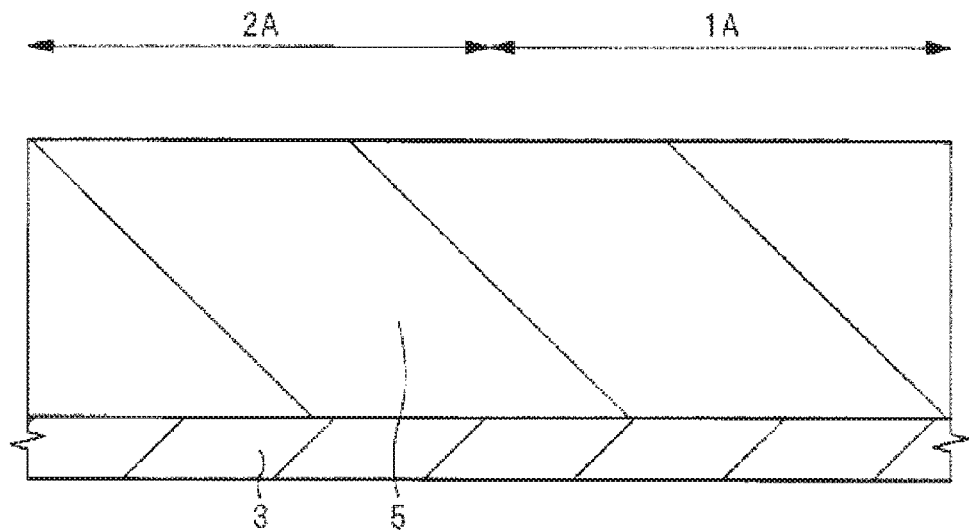

[FIG. 5]
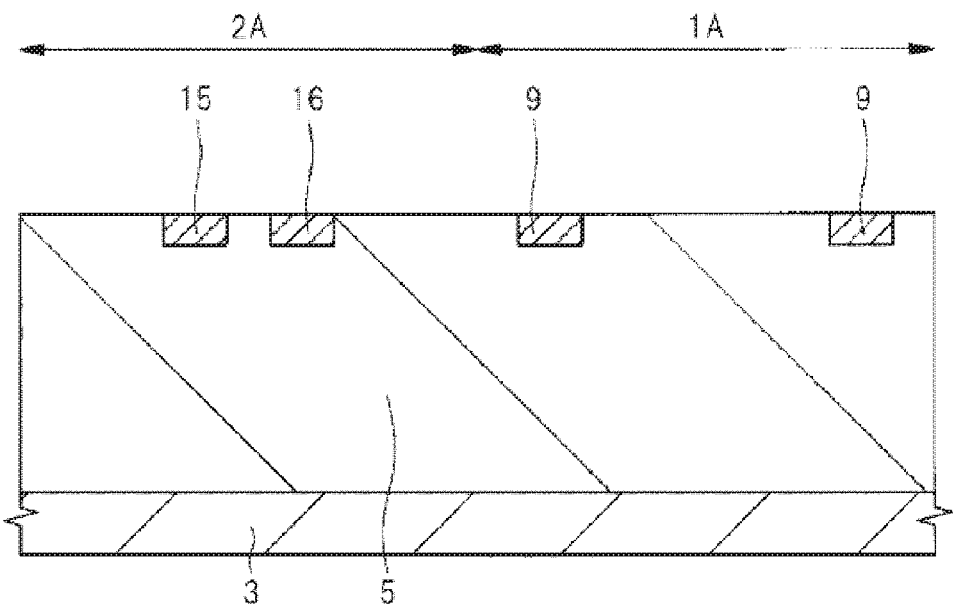
[FIG. 6]
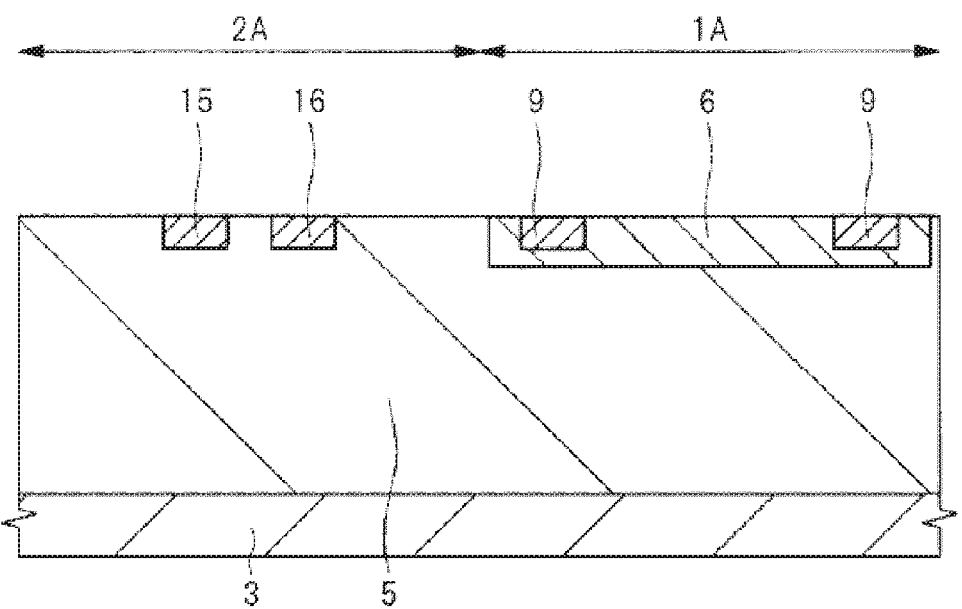

[FIG. 7]
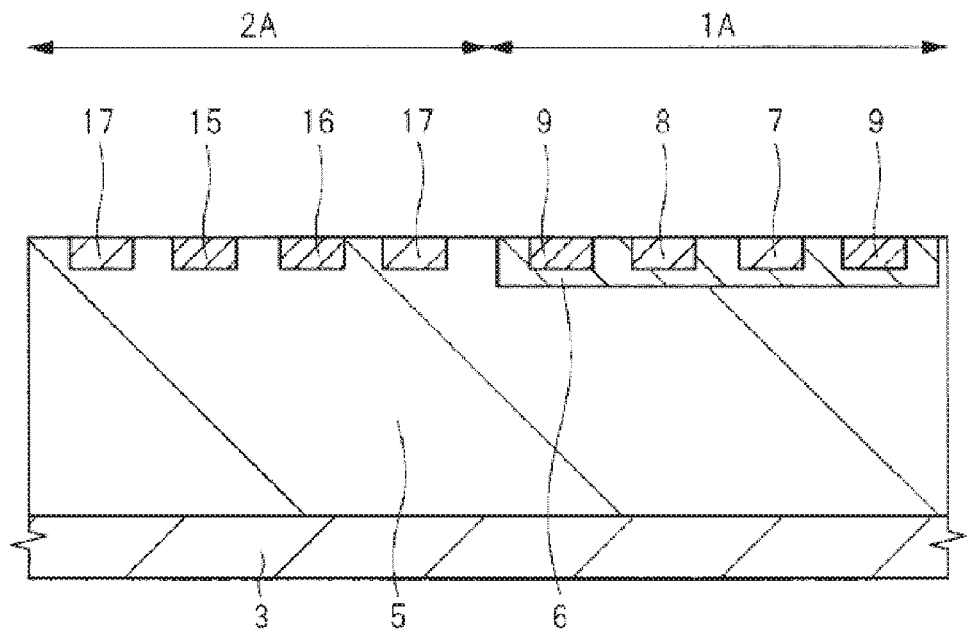
[FIG. 8]
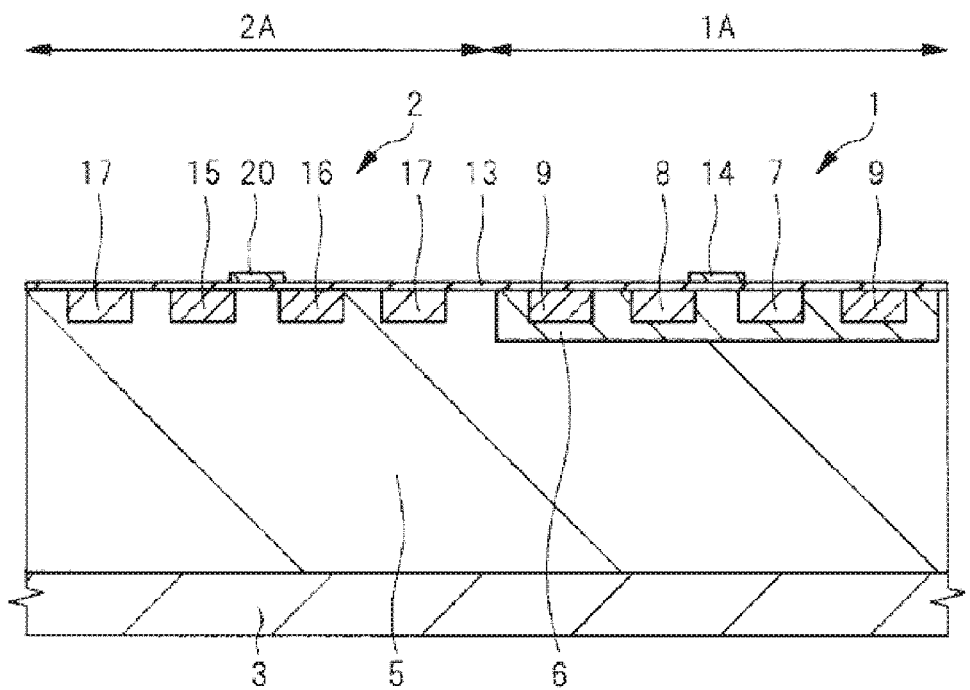

[FIG. 9]
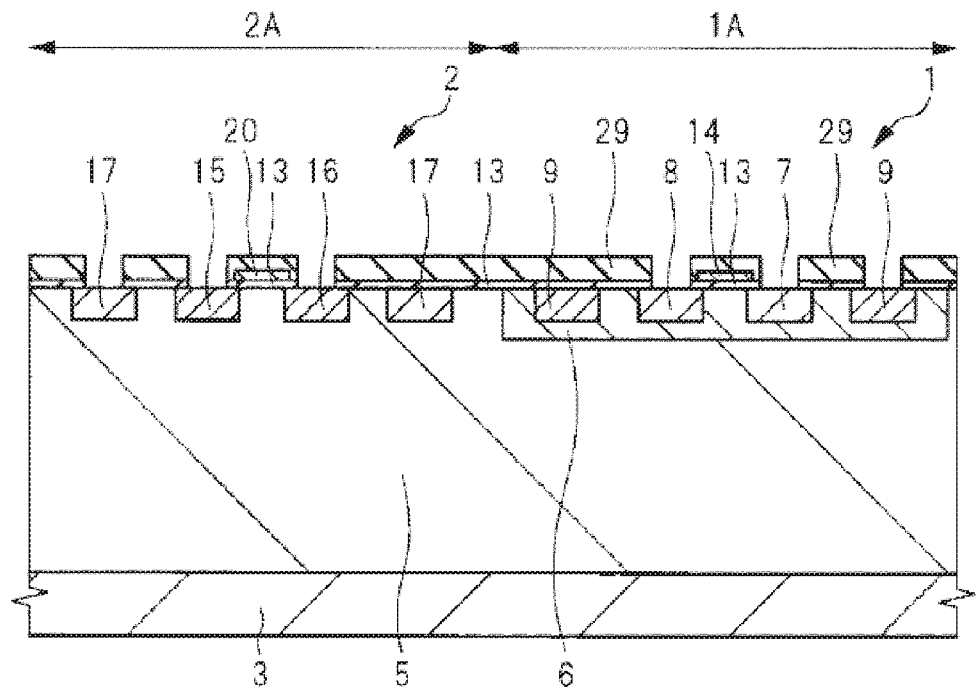
[FIG. 10]
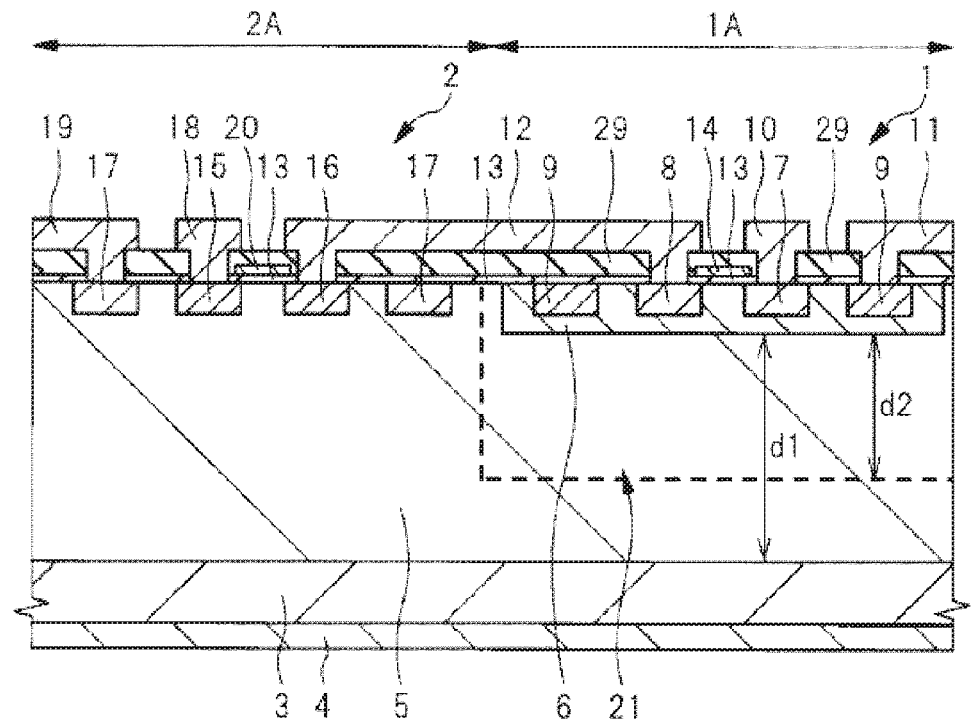

[FIG. 11]
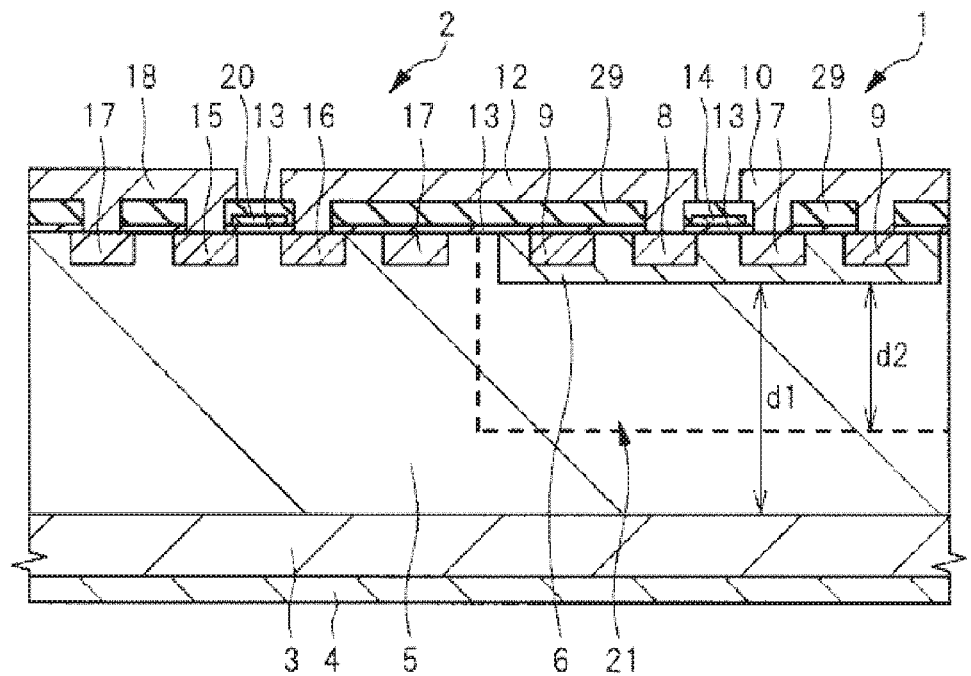
[FIG. 12]
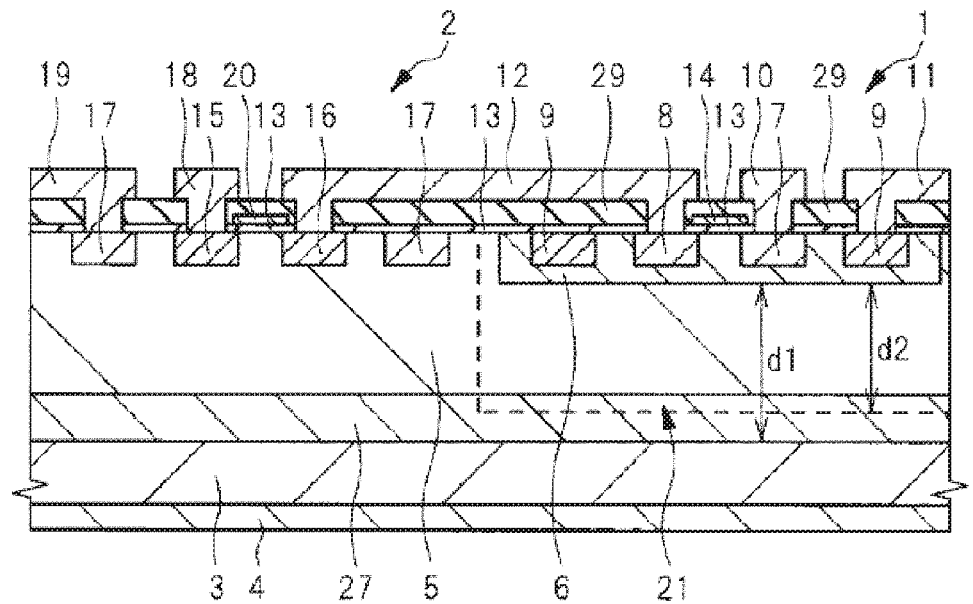

[FIG. 13]
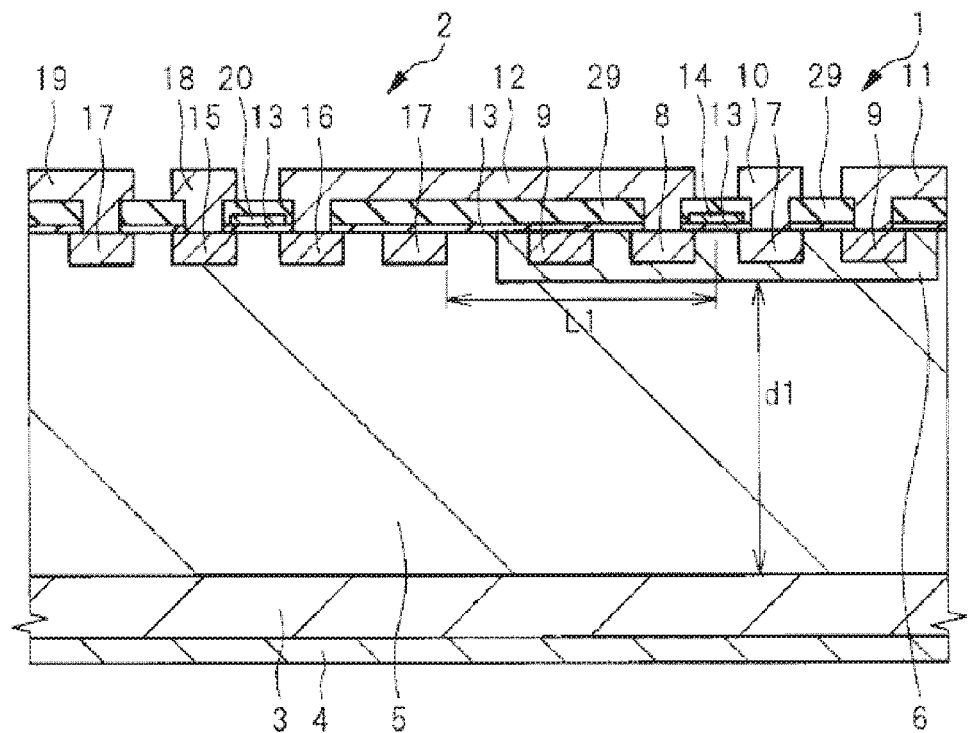
[FIG. 14]
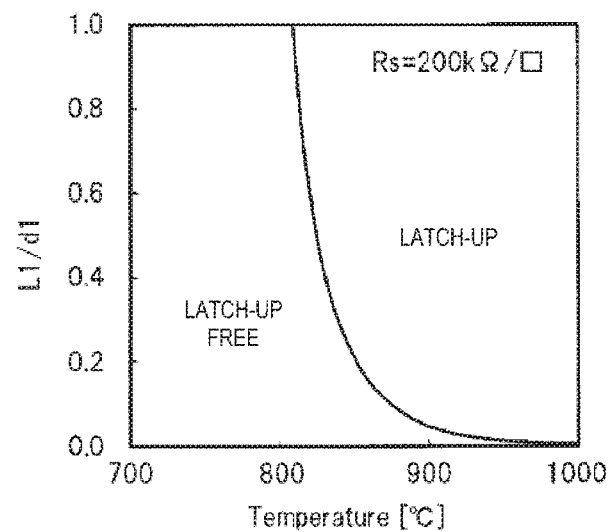

[FIG. 15]
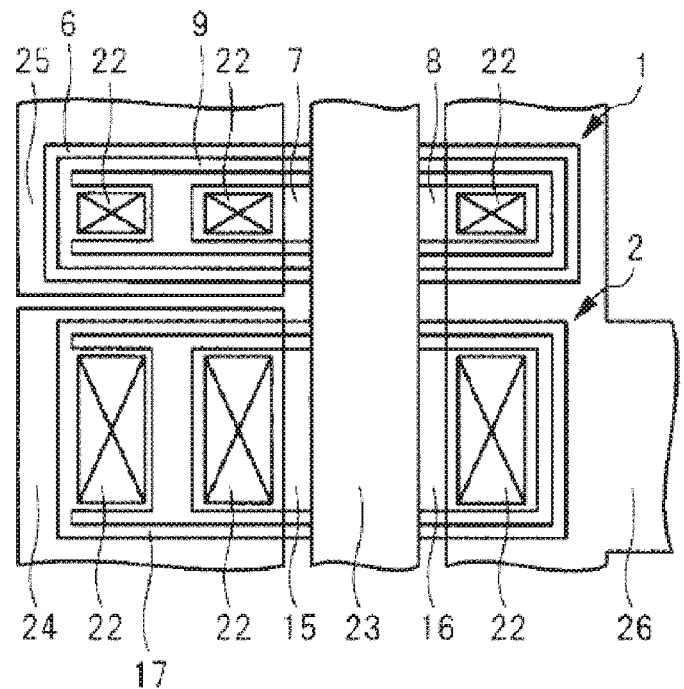
[FIG. 16]
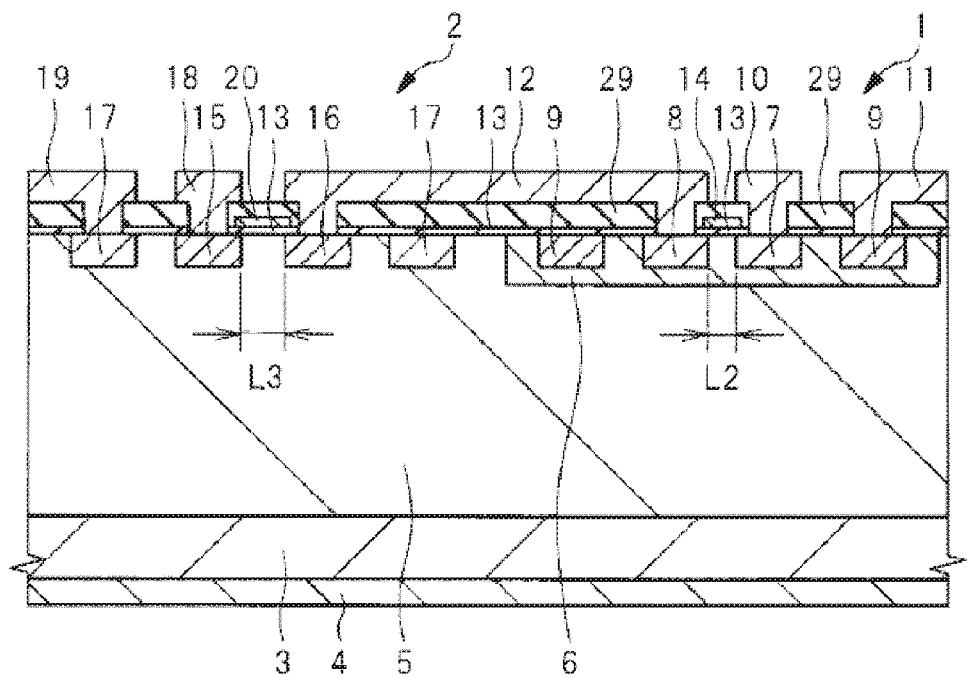

[FIG. 17]
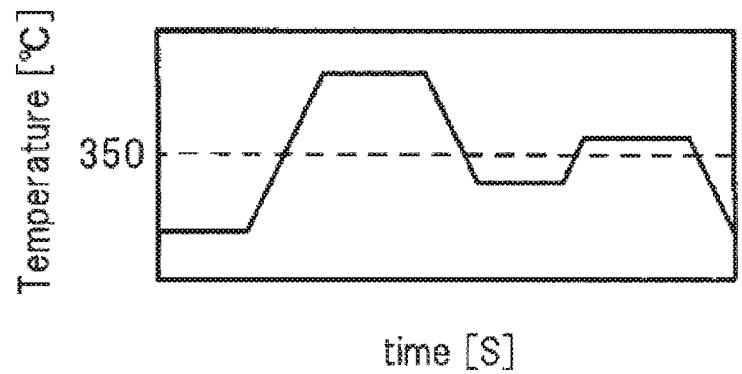
[FIG. 18]
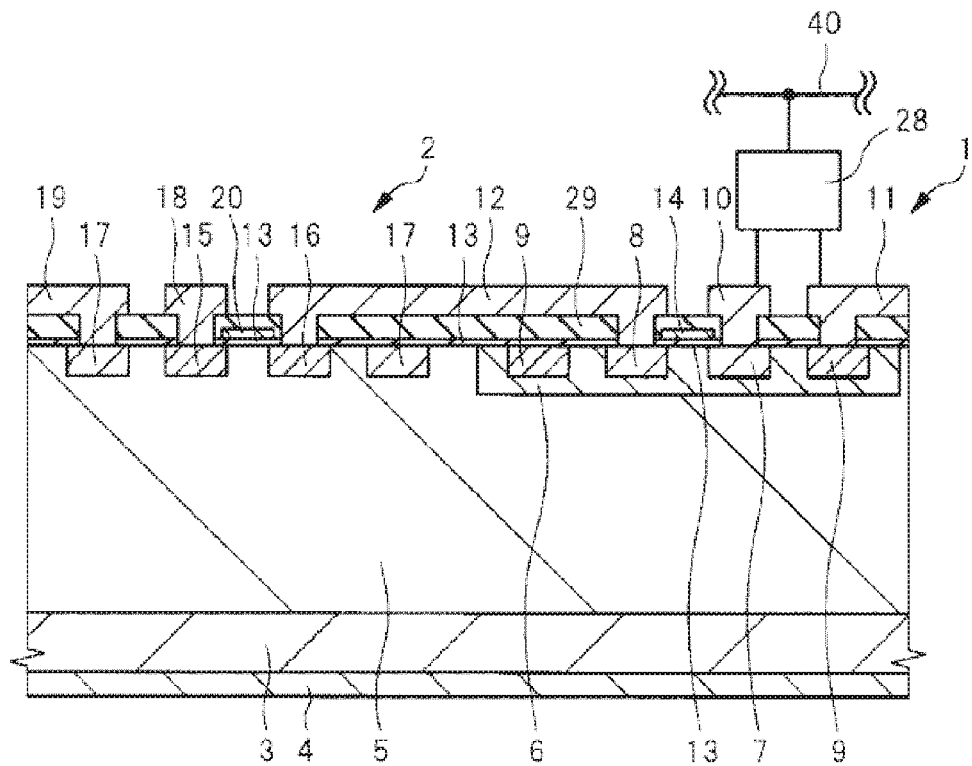

[FIG. 19]
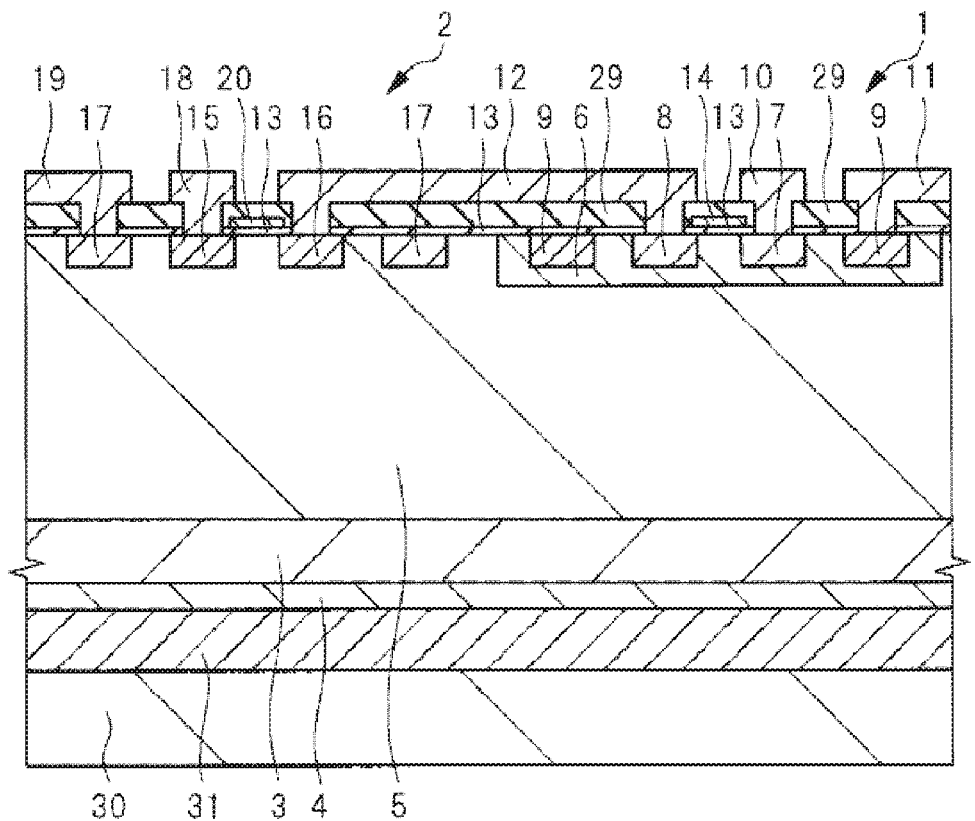
[FIG. 20]
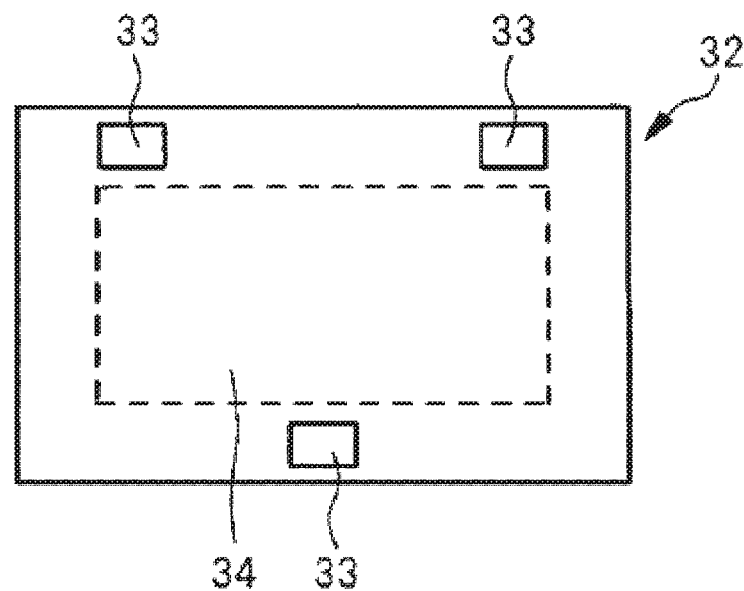

[FIG. 21]
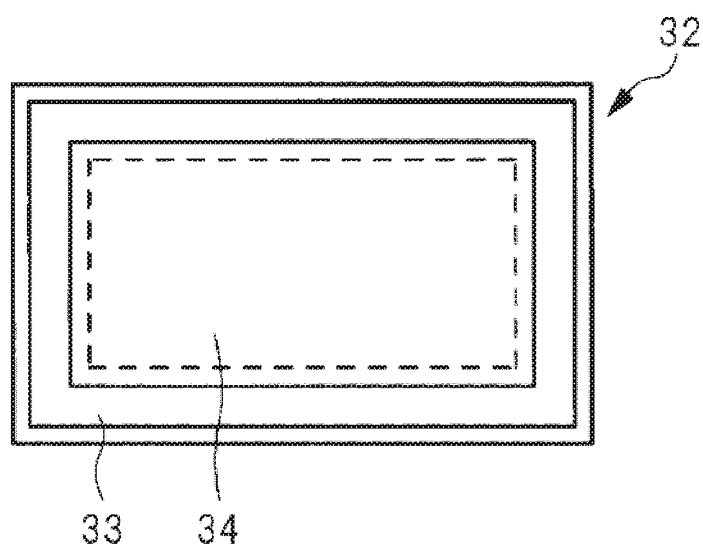

[FIG. 22]
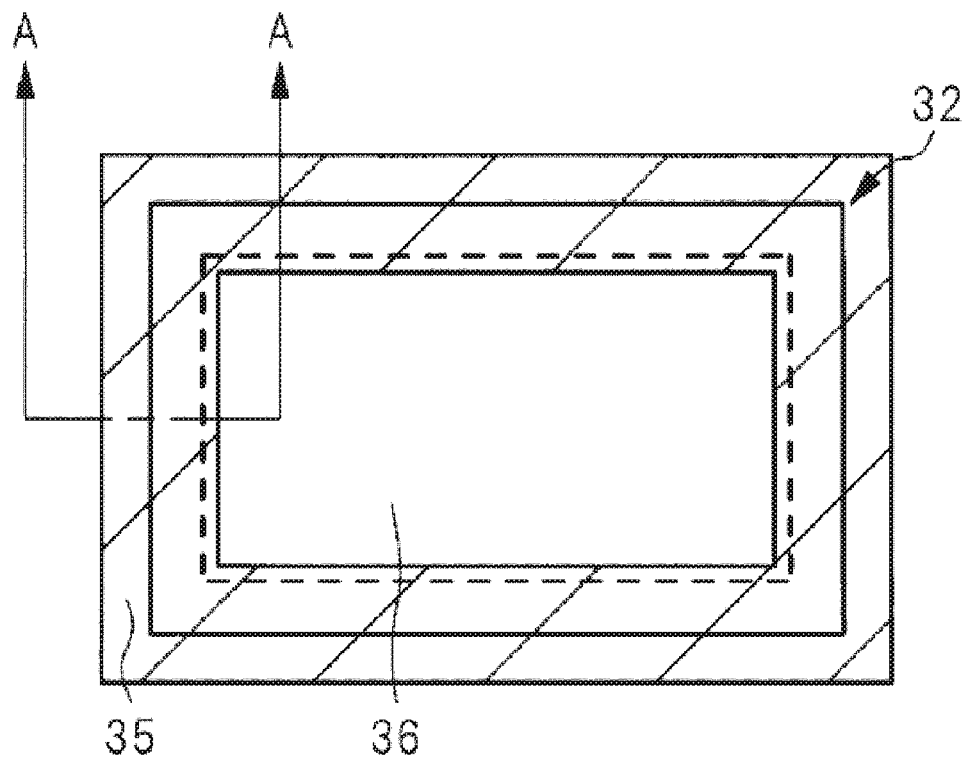
[FIG. 23]
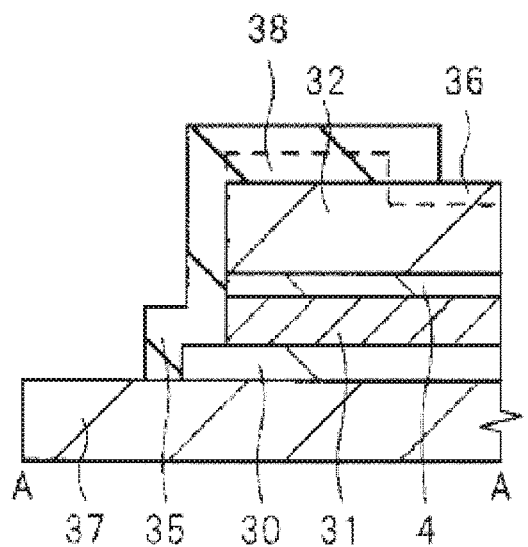

[FIG. 24]
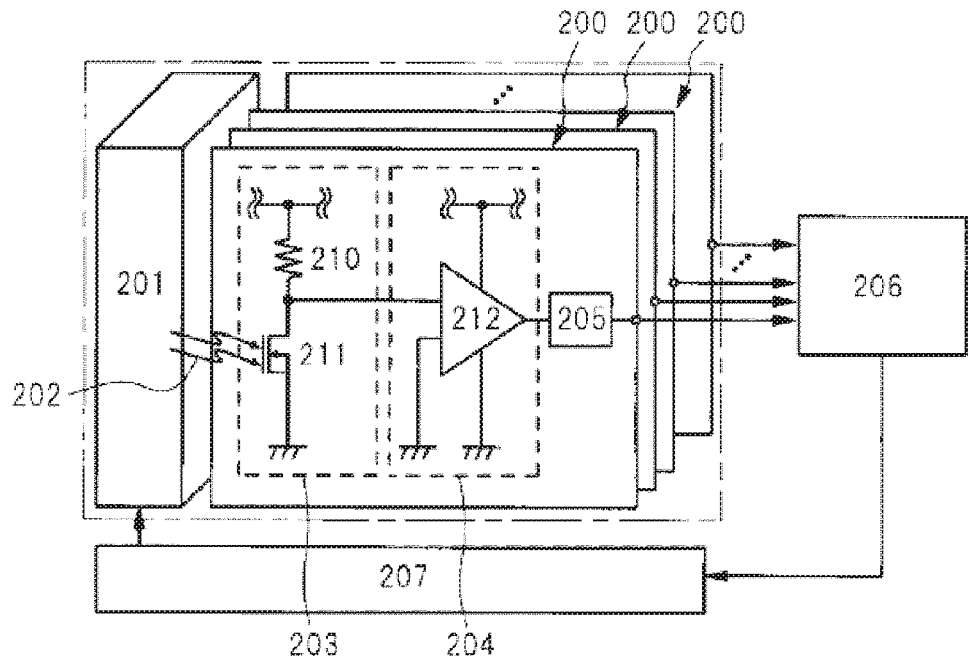
[FIG. 25]
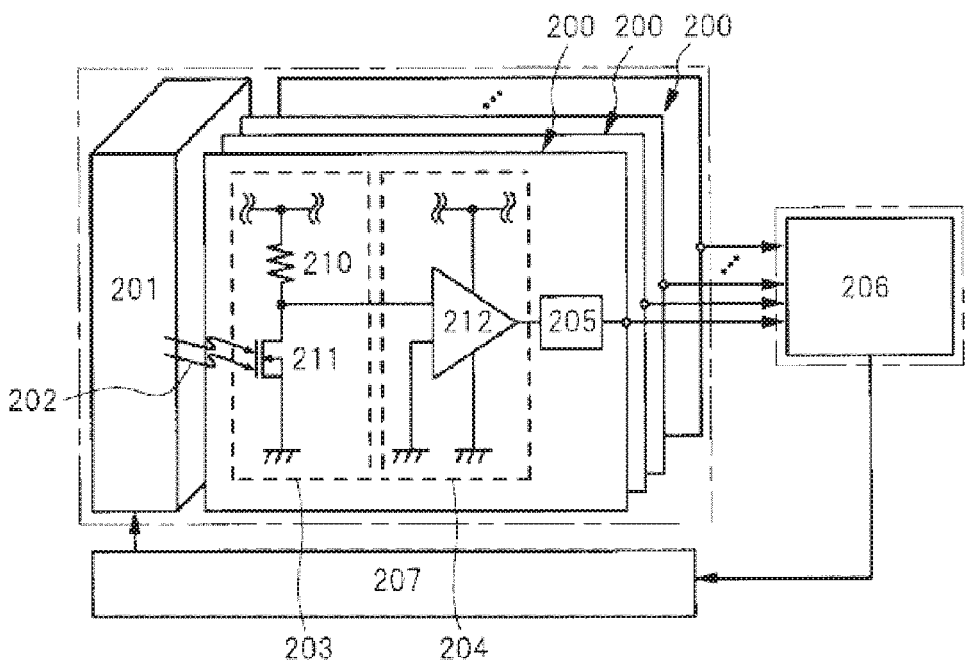

[FIG. 26]
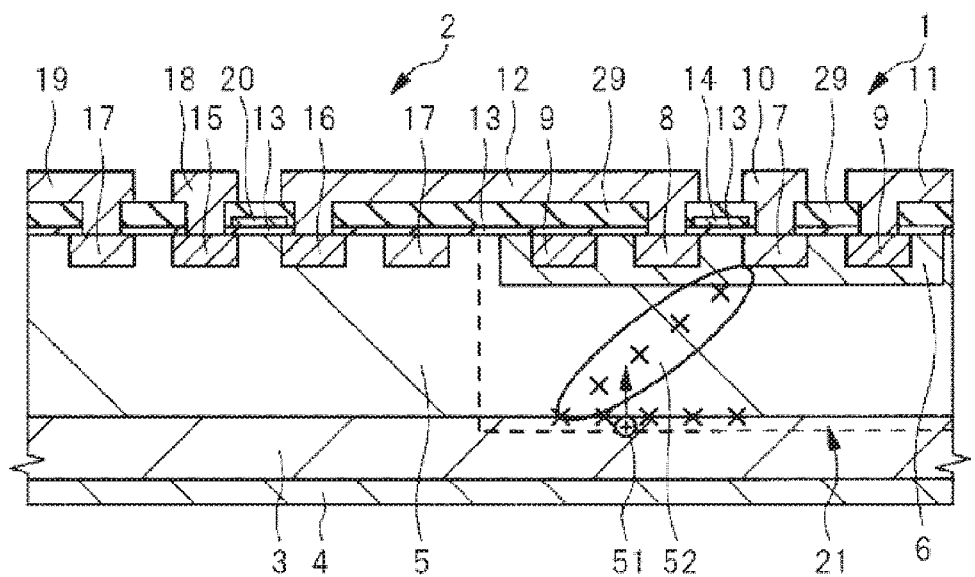
[FIG. 27]
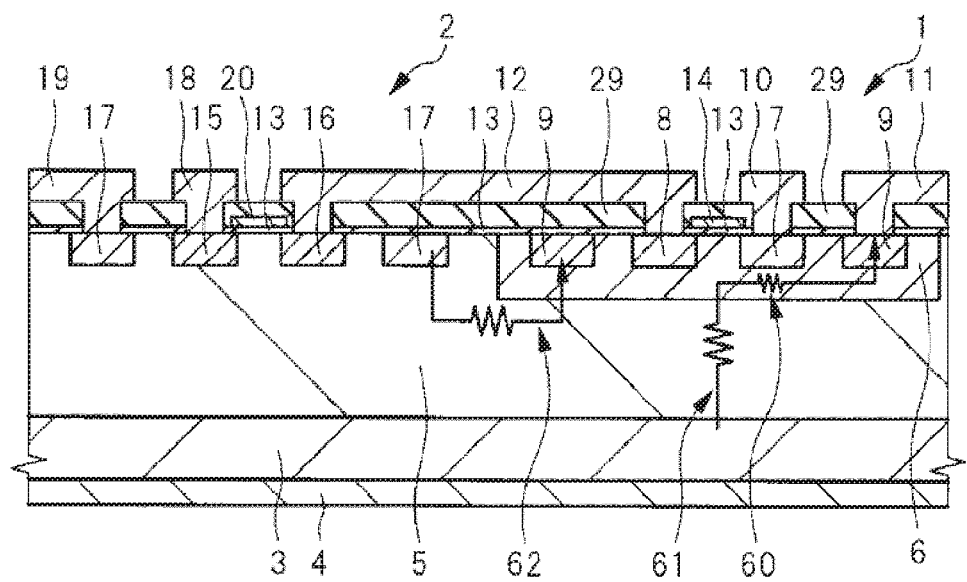

SEMICONDUCTOR DEVICE, METHOD OF MANUFACTURING SAME, AND SENSOR

TECHNICAL FIELD

The present invention relates to a semiconductor device, a method of manufacturing the same, and a sensor, and particularly to a complementary MOS (CMOS).

BACKGROUND ART

Currently, many manufactured industrial products employ a semiconductor element made of silicon (hereinafter, referred to as Si) as a material, and the performance of the semiconductor element is largely improved with the development of Si. However, in a product exposed to a harsh environment such as a high temperature or a high radiation field, the application of a general-purpose Si device is difficult, and it is required to develop a semiconductor element which operates reliably even in such an environment. It is known that silicon carbide (hereinafter, referred to as SiC) is a compound semiconductor composed of Si and carbon, and heat resistance and radiation resistance of SiC are superior to that of Si. Therefore, the application of a CMOS using SiC as a material is expected to improve the efficiency of the product which has heretofore been difficult to apply electrical products.

PTL 1 (JP-A-2000-508477) discloses a structure in which an epitaxial layer is provided on a SiC substrate, and a CMOS is formed on an upper part of the epitaxial layer. The structure includes an n-channel type MOSFET (hereinafter referred to as an nMOS) and a p-channel type MOSFET (hereinafter referred to as a pMOS), which are coupled to each other in a single device. That is, the nMOS and the pMOS are mounted on the same semiconductor chip. Here, the nMOS is formed on the p-type epitaxial layer to achieve a compatibility with the pMOS operation.

PRIOR ART LITERATURE

Patent Literature

PTL 1: JP-A-2000-508477

SUMMARY OF INVENTION

Technical Problem

At a boundary between the SiC substrate and the epitaxial layer, there is a base plane dislocation which is a defect caused in a formation process of the epitaxial layer on an upper surface of the SiC substrate. Meanwhile, in the CMOS described in PTL 1, there is a problem that the growth of the base plane dislocation is not considered, and the reliability is low.

The above and other objects and novel features of the invention will become apparent from the description of the specification and accompanying drawings.

Solution to Problem

The typical embodiment of the embodiments disclosed in the present application will be briefly described as follows.

A semiconductor device according to a typical embodiment includes an epitaxial layer on a SiC substrate, a semiconductor region formed on an upper surface of the epitaxial layer, a source region and a drain region formed on an upper surface of the semiconductor region, and a gate electrode formed on the semiconductor region between the source region and the drain region via an insulating film. Here, a thickness of a depletion layer extending from a lower surface of the semiconductor region to the semiconductor substrate is smaller than a distance from the lower surface of the semiconductor region to the semiconductor substrate.

Advantageous Effect

According to the typical embodiment, the reliability of the semiconductor device can be improved.

BRIEF DESCRIPTION OF DRAWINGS

FIG. 1 is a cross-sectional view showing a semiconductor device according to a first embodiment of the invention.

FIG. 2 is an equivalent circuit diagram showing the semiconductor device according to the first embodiment of the invention.

FIG. 3 is a graph showing a relationship between an impurity concentration of an epitaxial layer and a thickness of a depletion layer.

FIG. 4 is a cross-sectional view showing the semiconductor device during a manufacturing process according to the present embodiment.

FIG. 5 is a cross-sectional view of the semiconductor device during the manufacturing process continued from FIG. 4.

FIG. 6 is a cross-sectional view of the semiconductor device during the manufacturing process continued from FIG. 5.

FIG. 7 is a cross-sectional view of the semiconductor device during the manufacturing process continued from FIG. 6.

FIG. 8 is a cross-sectional view of the semiconductor device during the manufacturing process continued from FIG. 7.

FIG. 9 is a cross-sectional view of the semiconductor device during the manufacturing process continued from FIG. 8.

FIG. 10 is a cross-sectional view of the semiconductor device during the manufacturing process continued from FIG. 9.

FIG. 11 is a cross-sectional view showing a semiconductor device according to a modification of the first embodiment of the invention.

FIG. 12 is a cross-sectional view showing a semiconductor device according to a second embodiment of the invention.

FIG. 13 is a cross-sectional view showing a semiconductor device according to a third embodiment of the invention.

FIG. 14 is a graph showing a relationship between the presence or absence of a latch-up and the structure and temperature of the CMOS.

FIG. 15 is a plan view showing the semiconductor device according to the third embodiment of the invention.

FIG. 16 is a cross-sectional view showing a semiconductor device according to a fourth embodiment of the invention.

FIG. 17 is a graph showing a relationship between a use time of a semiconductor device of a fifth embodiment of the invention and a temperature of the semiconductor device.

FIG. 18 is a cross-sectional view showing a semiconductor device according to a sixth embodiment of the invention.

FIG. 19 is a cross-sectional view showing a semiconductor device according to a seventh embodiment of the invention.

FIG. 20 is a plan view showing the semiconductor device according to the seventh embodiment of the invention.

FIG. 21 is a plan view showing a semiconductor device according to a modification of the seventh embodiment of the invention.

FIG. 22 is a plan view showing the semiconductor device according to the seventh embodiment of the invention.

FIG. 23 is a cross-sectional view along a line A-A of FIG. 22.

FIG. 24 is a schematic circuit diagram of a sensor according to an eighth embodiment of the invention.

FIG. 25 is a schematic circuit diagram of a sensor according to a ninth embodiment of the invention.

FIG. 26 is a cross-sectional view showing a semiconductor device which is a comparative example.

FIG. 27 is a cross-sectional view showing a semiconductor device which is a comparative example.

DESCRIPTION OF EMBODIMENTS

Thereinafter, the embodiments of the invention will be described with reference to the drawings. In all the drawings for describing the embodiments, members having a same function are denoted by a same reference numeral, and repetitive description thereof will be omitted. Further, in the embodiments, the description of the same or similar parts will not be repeated unless it is particularly necessary. In the drawings for describing the embodiments, a hatching may be attached even in a plan view, a perspective view, or the like in order to make a configuration easy to understand.

In addition, signs "−" and "+" represent relative concentrations of an n-type impurity or a p-type impurity of an conductivity type, and for example, in the case of the n-type impurity, the impurity concentration increases in an order of "$n^-$", "n", and "$n^+$".

First Embodiment

<Structure of Semiconductor Device>

Hereinafter, the semiconductor device of the present embodiment will be described using FIG. 1 and FIG. 2. FIG. 1 is a cross-sectional view showing a complementary MOS-FET (CMOSFET) which is the semiconductor device of the present embodiment. FIG. 2 is an equivalent circuit diagram showing the CMOSFET (hereinafter, referred to as a CMOS) shown in FIG. 1.

As shown in FIG. 2, the CMOS has a structure in which an nMOS 101 and a pMOS 102 are complementarily connected, an output terminal 104 is connected between the nMOS 101 and the pMOS 102 in series, and a gate electrode of the nMOS 101 and a gate electrode of the pMOS 102 are connected by one input terminal 103, so as to form an NOT circuit. Both a drain electrode of the nMOS 101 and a drain electrode of pMOS 102 are connected to the output terminal 104. A source electrode of the pMOS 102 is connected to a high voltage terminal 105 to which a voltage (power supply voltage) Vdd is applied, and a source electrode of the nMOS 101 is connected to a low voltage terminal 106 to which a voltage (power supply voltage) Vss is applied.

FIG. 1 shows a cross-sectional structure of the CMOS which is the semiconductor device of the first embodiment. The CMOS as the semiconductor device of the present embodiment includes an nMOS 1 which is an n-type metal oxide semiconductor field effect transistor (MOSFET) and a pMOS 2 which is a p-type MOSFET, the nMOS 1 and the pMOS 2 being formed on the same substrate. The nMOS 1 and the pMOS 2 include an n-type semiconductor substrate 3 which is a SiC substrate, a back electrode 4 which is connected to a back surface on a side opposite to a main surface of the n-type semiconductor substrate 3, and an n-type epitaxial layer 5 which is formed on the main surface of the n-type semiconductor substrate 3 and in contact with the main surface. The n-type epitaxial layer 5 is a layer made of silicon carbide (SiC). That is, the semiconductor device of the present embodiment is a silicon carbide semiconductor device.

The nMOS 1 includes a p-type diffusion layer 6 which is formed on a part of an upper surface of the n-type epitaxial layer 5, and an $n^+$-type source region 7, an $n^+$-type drain region 8, and a $p^+$-type contact layer 9 which are intermittently formed on an upper surface of the p-type diffusion layer 6 and have an impurity concentration higher than that of the p-type diffusion layer 6. Further, the nMOS 1 includes a source electrode 10 connected to the $n^+$-type source region 7, a substrate electrode 11 connected to the $p^+$-type contact layer 9, an output electrode 12 connected to the $n^+$-type drain region 8, and a gate electrode 14 formed on the n-type epitaxial layer 5 between the $n^+$-type source region 7 and the $n^+$-type drain region 8 via an insulating film 13. The source electrode 10, the substrate electrode 11, and the output electrode 12 are formed on the n-type epitaxial layer 5.

That is, the $n^+$-type source region 7 is electrically connected to the source electrode 10, the $p^+$-type contact layer 9 is electrically connected to the substrate electrode 11, and the $n^+$-type drain region 8 is electrically connected to the output electrode 12.

The pMOS 2 includes a $p^+$-type source region 15, a $p^+$-type drain region 16, and an $n^+$-type contact layer 17 which are intermittently formed on the upper surface of the n-type epitaxial layer 5 and have a high impurity concentration. Further, the pMOS 2 includes a source electrode 18 connected to the $p^+$-type source region 15, a substrate electrode 19 connected to the $n^+$-type contact layer 17 and electrically connected to the back electrode 4, the output electrode 12 connected to the $p^+$-type drain region 16, and a gate electrode 20 formed on the n-type epitaxial layer 5 between the $p^+$-type source region 15 and the $p^+$-type drain region 16 via the insulating film 13. The source electrode 18 and the substrate electrode 19 are formed on the n-type epitaxial layer 5.

That is, the $p^+$-type source region 15 is electrically connected to the source electrode 18, the $n^+$-type contact layer 17 is electrically connected to the substrate electrode 19, and the $p^+$-type drain region 16 is electrically connected to the output electrode 12.

In the n-type semiconductor substrate 3, the n-type epitaxial layer 5, the $n^+$-type source region 7, the $n^+$-type drain region 8, and the $n^+$-type contact layer 17, N (nitrogen), for example, is introduced as an n-type impurity. Further, in the p-type diffusion layer 6, the $p^+$-type contact layer 9, the $p^+$-type source region 15, and the $p^+$-type drain region 16, Al (aluminum), for example, is introduced as a p-type impurity. As shown in FIG. 15, each of the $p^+$-type contact layer 9 and the $n^+$-type contact layer 17 has an annular shape in a plan view. In the plan view, the $p^+$-type source region 15 and the $p^+$-type drain region 16 are located on an inner side of the annular structure of the $n^+$-type contact layer 17, and the $n^+$-type source region 7 and the $n^+$-type drain region 8 are located on an inner side of the annular structure of the $p^+$-type contact layer 9.

An interlayer insulating film 29 is formed over the n-type epitaxial layer 5 shown in FIG. 1 via the insulating film 13. The insulating film 13 and the interlayer insulating film 29 are made of, for example, a silicon oxide film. A side surface and an upper surface of each of the gate electrodes 14 and 20 are covered with the interlayer insulating film 29. Each of the gate electrodes 14 and 20 is formed of a conductive film made of polysilicon, AL (aluminum), or Mo (molybdenum). The gate electrodes 14 and 20 are electrically connected to each other.

Hole portions (connection holes) penetrating a stacked film including the insulating film 13 and the interlayer insulating film 29 are opened right above the $n^+$-type source region 7, the $n^+$-type drain region 8, the $p^+$-type contact layer 9, the $p^+$-type source region 15, the $p^+$-type drain region 16, and the $n^+$-type contact layer 17. Apart of each of the source electrode 10, the substrate electrode 11, the output electrode 12, the source electrode 18, and the substrate electrode 19 is buried in the respective hole portion. In addition, the other part of each of the source electrode 10, the substrate electrode 11, the output electrode 12, the source electrode 18, and the substrate electrode 19 is formed on the interlayer insulating film 29. That is, each of the source electrode 10, the substrate electrode 11, the output electrode 12, the source electrode 18, and the substrate electrode 19 includes a connection portion (contact plug) in the hole portion and a wiring portion on the interlayer insulating film 29.

The source electrode 10, the substrate electrode 11, the output electrode 12, the source electrode 18 and the substrate electrode 19 are mainly made of, for example, Al (aluminum). The back electrode 4 is a conductive film, for example, containing Au (gold).

During the operation of the CMOS, a voltage Vdd is applied to the $p^+$-type source region 15 of the pMOS 2 via the source electrode 18; for example, the voltage Vdd is applied to the $n^+$-type contact layer 17 via the substrate electrode 19; and the same voltage as the substrate electrode 19 is applied to the back electrode 4. By applying, for example, the voltage Vdd to the n-type semiconductor substrate 3 via the back electrode 4 connected to a back surface of the n-type semiconductor substrate 3, it is possible to prevent fluctuation of a threshold voltage of the pMOS 2 and to prevent the occurrence of discharge at the end part of the semiconductor chip on which the CMOS is mounted. Further, during the operation of the CMOS, a voltage Vss is applied to the $n^+$-type source region 7 of the nMOS 1 via the source electrode 10, and, for example, the voltage Vss is applied to the $p^+$-type contact layer 9 via the substrate electrode 11.

The main feature of the semiconductor device of the present embodiment is that a distance d1 from an implantation depth (formation depth, bottom surface) of the p-type diffusion layer 6 to an interface between the n-type epitaxial layer 5 and the n-type semiconductor substrate 3 is larger than a thickness d2 of a depletion layer 21 extending from the p-type diffusion layer 6 to the back surface of the n-type semiconductor substrate 3 in response to a potential difference between the substrate electrode 11 and the substrate electrode 19 in the CMOS formed on the SiC substrate. In the figure, the outline of the depletion layer 21 is indicated by a broken line. The thickness in the present application refers to a length of a layer, a film, or a region in a direction perpendicular to the main surface of the n-type semiconductor substrate 3 (hereinafter, simply referred to as a perpendicular direction or a vertical direction).

Hereinafter, the effect of the semiconductor device of the present embodiment will be described with reference to FIG. 26 showing a semiconductor device of a comparative example. FIG. 26 is a cross-sectional view showing the semiconductor device according to the comparative example. The CMOS structure as the semiconductor device of the comparative example shown in FIG. 26 has a larger thickness of the depletion layer 21 with respect to the thickness of the n-type epitaxial layer 5, and is different from the CMOS of the present embodiment shown in FIG. 1 in this respect.

When an epitaxial layer is formed on the SiC substrate, defects may be formed at an interface between the SiC substrate and the epitaxial layer, the defects grow when a current flows through the defects, and the defects extend in the epitaxial layer, causing a problem that the reliability of the semiconductor device is lowered.

That is, a plurality of defects shown by X in the figure are formed in the interface between the n-type semiconductor substrate (bulk substrate) 3 and the n-type epitaxial layer 5 shown in FIG. 26, and various defects propagated from the defects are formed in the n-type epitaxial layer 5. The n-type epitaxial layer 5 is a layer formed on a surface inclined one or more degrees with respect to a base surface by an epitaxial growth method. Therefore, when a current flows in a base plane dislocation (defects located on the main surface of the n-type semiconductor substrate 3 shown in FIG. 26) included in the (0001) base plane of the n-type semiconductor substrate 3, the base plane dislocation grows in a direction oblique from the main surface of the n-type semiconductor substrate 3 to the upper surface of the n-type epitaxial layer 5 in response to a recombination energy of an electron and a hole.

When the base plane dislocation grows, a Shockley type stacking defect is formed in the n-type epitaxial layer 5. Since the stacking defect promotes the recombination of the electron and the hole, the on-resistance and the leakage current increase in a semiconductor element formed on the n-type semiconductor substrate 3. Further, since the value varies depending on the defect density, the reliability of the semiconductor device is lowered. Since a differential circuit used in, particularly, an amplifier circuit is strongly affected by variations in device characteristics, it is necessary to minimize characteristic deterioration. That is, it is important to reduce the minority carrier current flowing to the interface between the n-type semiconductor substrate 3 and the n-type epitaxial layer 5 and suppress the growth of the base plane dislocation in order to achieve high reliability of the semiconductor device.

In the semiconductor device shown in FIG. 26, the depletion layer 21 extends from the bottom part of the p-type diffusion layer 6 to the back surface side of the n-type semiconductor substrate 3 in response to the potential difference between a high voltage terminal and a ground terminal. That is, during the operation of the CMOS, the depletion layer 21 is generated in the n-type epitaxial layer 5 in response to the difference between a relatively high voltage Vdd applied to the $p^+$-type source region 15 and a relatively low voltage Vss applied to the $n^+$-type source region 7. Here, the impurity concentration in the n-type epitaxial layer 5 is $2\times10^{15}$ cm$^{-3}$ to $2\times10^{16}$ cm$^{-3}$, the thickness of the n-type epitaxial layer 5 is about 3 μm, the value of the voltage Vdd is, for example, 15 V, and the value of the voltage Vss is, for example, 0 V. In this case, as shown in FIG. 26, it is expected that the depletion layer 21 extending from the bottom part of the p-type diffusion layer 6 reaches the interface between the n-type semiconductor substrate 3 and the n-type epitaxial layer 5.

Since the CMOS is formed of a lateral element allowing a current to flow to the upper surface of the n-type epitaxial layer 5, a reverse leakage current corresponding to the potential difference between the nMOS 1 and the pMOS 2 flows at the interface between the n-type semiconductor substrate 3 and the n-type epitaxial layer 5. The reverse leakage current is a current flowing from the interface to the substrate electrode 11 via the p-type diffusion layer 6 and the p⁺-type contact layer 9. In an environment of 350° C. or lower where the Shockley type stacking defect grows, the leakage current is mainly a current generated in a region where the depletion layer is formed. The main process of the generation/recombination of a minority carrier 51 is a process of discharging the electron and the hole via a generation/recombination center in a band gap. In other words, during the operation of the CMOS, an electron/hole pair is generated in the depletion layer 21, and the minority carrier 51 moves, so that the leakage current flows.

The generated minority carrier 51 (here, hole) drifts to the p-type diffusion layer 6 having a low potential, and moves to the ground terminal through the p⁺-type contact layer 9 and the substrate electrode 11. Here, when the depletion layer 21 reaches the interface between the n-type semiconductor substrate 3 and the n-type epitaxial layer 5 as in the comparative example, the recombination with the electron occurs at the interface in a carrier (hole) transport process, making the base plane dislocation grow. FIG. 26 shows a state where the base plane dislocation grows in defects 52 surrounded by an ellipse. The defects 52 grow obliquely upward from the interface in the n-type epitaxial layer 5.

The growth of the dislocation in the lateral element due to the leakage current is smaller than the growth of the dislocation in a vertical bipolar device, but devices exposed to a harsh environment, such as a high temperature or a high radiation field, are often difficult to be maintained and exchanged in a short period of time and continues to be used for a long period of time. Therefore, in a device used in a harsh environment, the growth of the base plane dislocation due to the leakage current cannot be ignored from the viewpoint of long-term reliability, and it is necessary to prevent the growth of the dislocation. The high temperature environment here includes, for example, an environment near an engine of an automobile. Further, examples of the high radiation field include an environment in an outer space or a nuclear power plant.

As described above, in the semiconductor device of the comparative example having the lateral element, since the depletion layer 21 reaches the interface between the n-type semiconductor substrate 3 and the n-type epitaxial layer 5, the base plane dislocation grows on the interface to the n-type epitaxial layer 5 due to the leakage current flowing in the depletion layer 21. Accordingly, the on-resistance and the leakage current increase in the semiconductor element (for example, CMOS) formed on the upper part of the n-type epitaxial layer 5, and the reliability of the semiconductor device is lowered.

Thus, in the present embodiment, as shown in FIG. 1, a semiconductor device is realized in which the distance d1 from the implantation depth of the p-type diffusion layer 6 to the interface between the n-type epitaxial layer 5 and the n-type semiconductor substrate 3 is larger than the thickness d2 of the depletion layer 21 extending from the p-type diffusion layer 6 in response to the potential difference between the substrate electrode 11 and the substrate electrode 19.

That is, by making the distance d1 from the p-type diffusion layer 6 to the bottom surface of the n-type epitaxial layer 5 larger than the thickness d2 of the depletion layer 21 extending from the p-type diffusion layer 6, a structure in which the depletion layer 21 does not reach the interface between the n-type semiconductor substrate 3 and the n-type epitaxial layer 5 is realized. Even in the semiconductor device of the present embodiment, the base plane dislocation is formed at the interface between the n-type epitaxial layer 5 and the n-type semiconductor substrate 3, and a leakage current may flow since a small carrier is generated in the depletion layer 21. However, since the depletion layer 21 in which the leakage current flows does not reach the interface, it is possible to prevent a leakage current from flowing into the dislocation (defect) formed at the interface.

Therefore, it is possible to prevent the growth of the defects 52 (see FIG. 26), caused by the leakage current flowing into the defects present at the interface between the n-type semiconductor substrate 3 and the n-type epitaxial layer 5, in the n-type epitaxial layer 5. That is, in a CMOS using SiC as a material, the recombination of the electron and the hole at the interface between the bulk substrate and the epitaxial layer can be suppressed. Therefore, characteristic deterioration of the CMOS caused by the growth of the base plane dislocation can be suppressed, and thus the reliability of the semiconductor device can be improved.

FIG. 3 is a graph showing a relationship between the impurity concentration of the n-type epitaxial layer 5 and the thickness d2 of the depletion layer 21 when an acceptor concentration (impurity concentration) $N_A$ of the p-type diffusion layer 6 shown in FIG. 1 is $5 \times 10^{17}$ cm⁻³. FIG. 3 shows a graph when the value of Vdd-Vss is 5 V, 10 V, 15 V, and 20 V, respectively.

The distance at which the depletion layer 21 extends downward from the p-type diffusion layer 6, that is, the thickness d2 of the depletion layer 21 depends mainly on the impurity concentration of the n-type epitaxial layer 5 and the power supply voltage (Vdd-Vss), decreases as the power supply voltage (the potential difference between the voltage Vdd (unit: V) and the voltage Vss (unit: V)) increases, and decreases as the impurity concentration of the n-type epitaxial layer 5 increases. In the present embodiment, the power supply voltage (Vdd-Vss) is, for example, 50 V or less. From the graph shown in FIG. 3, when the power supply voltage is set to 15 V and the impurity concentration of the n-type epitaxial layer 5 is set to $1 \times 10^{15}$ cm⁻³, the thickness d2 is estimated to be 4.4 μm. Therefore, in order to realize a structure in which the depletion layer 21 shown in FIG. 1 does not reach the interface between the n-type semiconductor substrate 3 and the n-type epitaxial layer 5, the distance d1 needs to be larger than at least 4.4 μm.

The thickness d2 (unit: μm) of the depletion layer 21 shown in FIG. 1 is represented by the following Equation 1.

$$d2 = (2\varepsilon_{SiC}(\text{Vbi}+\text{Vdd}-\text{Vss})/qN_D) \quad (1)$$

Here, $\varepsilon_{SiC}$ is the dielectric constant (unit: F/m) of SiC, Vbi is a built-in voltage (unit: V) at a pn junction between the n-type epitaxial layer 5 and the p-type diffusion layer 6, q is the point charge (unit: C), and $N_D$ is the impurity concentration (unit: cm⁻³) of the n-type epitaxial layer 5. Since the distance d1, which is the shortest distance from the p-type diffusion layer 6 to the interface between the n-type epitaxial layer 5 and the n-type semiconductor substrate 3 in the vertical direction, is larger than the thickness d2, here, the distance d1 (unit: μm) can be represented by the following relationship (2).

$$d1 > (2\varepsilon_{SiC}(\text{Vbi}+\text{Vdd}-\text{Vss})/qN_D) \quad (2)$$

<Method of Manufacturing Semiconductor Device>

Hereinafter, a method of manufacturing the semiconductor device of the present embodiment will be described using FIG. 4 to FIG. 10. FIG. 4 to FIG. 10 are cross-sectional views during a manufacturing process of the semiconductor device of the present embodiment.

First, as shown in FIG. 4, the n-type semiconductor substrate 3 having the main surface and the back surface opposite to the main surface is prepared. The n-type semiconductor substrate 3 includes an nMOS region 1A and a pMOS region 2A aligned in a direction along the main surface of the n-type semiconductor substrate 3. The n-type semiconductor substrate 3 is a substrate made of silicon carbide (SiC), that is, a SiC substrate. In FIG. 4, the pMOS region 2A is shown on the left side of the figure, and the nMOS region 1A is shown on the right side of the figure. Subsequently, the n-type epitaxial layer 5 is formed on the main surface of the n-type semiconductor substrate 3 by an epitaxial growth method. Here, the n-type epitaxial layer 5 is grown while an n-type impurity (for example, N (nitrogen)) is introduced into the n-type epitaxial layer 5.

In this case, as described with reference to FIG. 1 and FIG. 3, the n-type epitaxial layer 5 having a sufficiently large thickness is formed, such that a depletion layer generated on the upper surface side of the n-type epitaxial layer 5 in the later formed nMOS does not reach the interface between the n-type epitaxial layer 5 and the n-type semiconductor substrate 3. Further, in order to prevent the depletion layer from reaching the interface, the n-type epitaxial layer 5 having a sufficiently high n-type impurity concentration is formed. The n-type impurity concentration of the n-type epitaxial layer 5 is, for example, $1\times10^{15}$ cm$^{-3}$.

Next, as shown in FIG. 5, a p-type impurity (for example, Al (aluminum)) is implanted into the upper surface of the n-type epitaxial layer 5 by using a photolithography technique and an ion implantation method. Accordingly, the p$^+$-type contact layer 9, which is a p-type semiconductor region, is formed on the upper surface of the n-type epitaxial layer 5 in the nMOS region 1A, and the p$^+$-type source region 15 and the p$^+$-type drain region 16, which are p-type semiconductor regions, are formed on the upper surface of the n-type epitaxial layer 5 in the pMOS region 2A. Each of the p$^+$-type contact layer 9, the p$^+$-type source region 15, and the p$^+$-type drain region 16 extends from the upper surface of the n-type epitaxial layer 5 to an intermediate depth of the n-type epitaxial layer 5, and does not reach the interface between the n-type epitaxial layer 5 and the n-type semiconductor substrate 3.

Next, as shown in FIG. 6, a p-type impurity (for example, Al (aluminum)) is implanted into the upper surface of the n-type epitaxial layer 5 in the nMOS region 1A by using a photolithography technique and an ion implantation method. Accordingly, the p-type diffusion layer 6, which is a p-type semiconductor region, is formed on the upper surface of the n-type epitaxial layer 5 in the nMOS region 1A. The p-type diffusion layer 6 has a lower p-type impurity concentration and a deeper forming depth than the p$^+$-type contact layer 9, the p$^+$-type source region 15, and the p$^+$-type drain region 16. However, the lower surface of the p-type diffusion layer 6 does not reach the interface between the n-type epitaxial layer 5 and the n-type semiconductor substrate 3. The p$^+$-type contact layer 9 is located on the upper surface of the p-type diffusion layer 6 and has an annular shape in the plan view.

Next, as shown in FIG. 7, an n-type impurity (for example, N (nitrogen)) is implanted into the upper surface of the n-type epitaxial layer 5 by using a photolithography technique and an ion implantation method. Accordingly, the n$^+$-type source region 7 and the n$^+$-type drain region 8, which are n-type semiconductor regions, are formed on the upper surface of the n-type epitaxial layer 5 in the nMOS region 1A, and the n$^+$-type contact layer 17, which is an n-type semiconductor region, is formed on the upper surface of the n-type epitaxial layer 5 in the pMOS region 2A. The formation depth of each of the n$^+$-type source region 7, the n$^+$-type drain region 8, and the n$^+$-type contact layer 17 is shallower than the formation depth of the p-type diffusion layer 6. The n$^+$-type source region 7 and the n$^+$-type drain region 8 are formed in a position surrounded by the p$^+$-type contact layer 9 in the plan view on the upper surface of the p-type diffusion layer 6. The n$^+$-type contact layer 17 is formed in an annular shape so as to surround the p$^+$-type source region 15 and the p$^+$-type drain region 16 in the plan view.

Next, as shown in FIG. 8, a thin insulating film 13 and a conductive film are sequentially formed on the n-type epitaxial layer 5 by, for example, a chemical vapor deposition (CVD) method. The insulating film 13 is made of, for example, a silicon oxide film, and the conductive film is made of, for example, polysilicon, Al (aluminum), or Mo (molybdenum). Subsequently, the conductive film is processed using a photolithography technique and an etching method, thereby exposing an upper surface of a part of the insulating film 13.

According to this processing step, the gate electrode 14 made of a conductive film is formed in the nMOS region 1A, and the gate electrode 20 made of a conductive film is formed in the pMOS region 2A. The gate electrode 14 is formed right above the upper surface of the n-type epitaxial layer 5 (p-type diffusion layer 6) between the n$^+$-type source region 7 and the n$^+$-type drain region 8 via the insulating film 13 which is a gate insulating film. Further, the gate electrode 20 is formed right above the upper surface of the n-type epitaxial layer 5 between the p$^+$-type source region 15 and the p$^+$-type drain region 16 via the insulating film 13 which is a gate insulating film. Accordingly, on the nMOS region 1A, the nMOS 1 including at least the gate electrode 14, the n$^+$-type source region 7, and the n$^+$-type drain region 8 is formed. In addition, in the pMOS region 2A, the pMOS 2 including at least the gate electrode 20, the p$^+$-type source region 15, and the p$^+$-type drain region 16 is formed.

Next, as shown in FIG. 9, the interlayer insulating film 29 is formed on the n-type epitaxial layer 5 using, for example, a CVD method. The interlayer insulating film 29 is made of, for example, a silicon oxide film. Here, the interlayer insulating film 29 covers the side surfaces and the upper surfaces of the gate electrodes 14 and 20, and covers the upper surface of the insulating film 13. Subsequently, by using a photolithography technique and an etching method on the interlayer insulating film 29, the interlayer insulating film 29 and the insulating film 13 are penetrated to form a plurality of connection holes exposing the upper surface of the n-type epitaxial layer 5. At the bottom part of each connection hole, the n$^+$-type source region 7, the n$^+$-type drain region 8, the p$^+$-type contact layer 9, the p$^+$-type source region 15, the p$^+$-type drain region 16, or the n$^+$-type contact layer 17 is exposed from the stacked film including the interlayer insulating film 29 and the insulating film 13.

Next, as shown in FIG. 10, a metal film is formed on the n-type epitaxial layer 5 and the interlayer insulating film 29 using, for example, a sputtering method. The metal film is mainly made of, for example, Al (aluminum) and is embedded in each of the plurality of connection holes. Subsequently, the metal film on the interlayer insulating film 29 is processed by using a photolithography technique and an etching method, thereby exposing a part of the upper surface of the interlayer insulating film 29. Accordingly to this processing step, the metal film is isolated, and the source electrode 10, the substrate electrode 11, the output electrode 12, the source electrode 18, and the substrate electrode 19, which are made of the metal film, are formed.

The source electrode 10 is connected to the n$^+$-type source region 7, the substrate electrode 11 is connected to the p$^+$-type contact layer 9, the output electrode 12 is connected to the n$^+$-type drain region 8 and the p$^+$-type drain region 16, the source electrode 18 is connected to the p$^+$-type source region 15, and the substrate electrode 19 is connected to the n$^+$-type contact layer 17. Subsequently, the back electrode 4 covering the back surface of the n-type semiconductor substrate 3 is formed using, for example, a sputtering method. The back electrode 4 is, for example, a conductive film containing Au (gold), and is electrically connected to the substrate electrode 19 and the n$^+$-type contact layer 17.

According to the steps above, it is possible to form a CMOS in which the nMOS 1 and the pMOS 2 are complementarily connected as the semiconductor device of the present embodiment.

The CMOS formed by the method of manufacturing the semiconductor device of the present embodiment is characterized in that the distance d1 from the bottom surface of the p-type diffusion layer 6 to the interface between the n-type epitaxial layer 5 and the n-type semiconductor substrate 3 is larger than the thickness d2 of the depletion layer 21 extending from the p-type diffusion layer 6 in response to the potential difference between the substrate electrode 11 and the substrate electrode 19. Accordingly, the same effect as that of the semiconductor device described using FIG. 1 and FIG. 3 can be obtained.

That is, by realizing the structure in which the depletion layer 21 does not reach the interface between the n-type semiconductor substrate 3 and the n-type epitaxial layer 5, it is possible to prevent the growth of the defects 52 (see FIG. 26), caused by the leakage current in the depletion layer 21, in the n-type epitaxial layer 5. Therefore, the characteristic deterioration of the CMOS caused by the growth of the base plane dislocation can be suppressed, and thus the reliability of the semiconductor device can be improved.

<Modification>

FIG. 11 shows a cross-sectional view of a semiconductor device according to a modification of the present embodiment. Unlike the structure shown in FIG. 1, the source electrode 10 and the substrate electrode 11 (see FIG. 1) may be connected by the same metal as shown in FIG. 11. Similarly, the source electrode 18 and the substrate electrode 19 (see FIG. 1) may be connected by the same metal. With such a configuration, it is possible to reduce a chip area along with the commonization of a wiring pattern, and it is possible to reduce the size of the semiconductor device.

Second Embodiment

FIG. 12 shows a semiconductor device according to a second embodiment. The semiconductor device of the present embodiment has a structure in which the depletion layer does not reach the interface between the n-type semiconductor substrate 3 and the n-type epitaxial layer 5 as in the first embodiment, and is characterized in that an n-type buffer layer 27 having an n-type impurity concentration higher than that of the n-type epitaxial layer 5 is provided between the n-type semiconductor substrate 3 and the n-type epitaxial layer 5. The buffer layer 27 is an epitaxial layer (semiconductor layer) formed on the n-type semiconductor substrate 3 by an epitaxial growth method, a lower surface of the buffer layer 27 is in contact with the n-type semiconductor substrate 3, and an upper surface of the buffer layer 27 is in contact with the n-type epitaxial layer 5. In other words, the buffer layer 27 is interposed between the n-type semiconductor substrate 3 and the n-type epitaxial layer 5.

In the manufacturing process of the semiconductor device, when the epitaxial layer is formed on the n-type semiconductor substrate 3 in the step described using FIG. 4, an epitaxial layer including the buffer layer 27 and an n-type epitaxial layer is formed by changing the growth conditions as follows. That is, first, the buffer layer 27 is formed by performing the epitaxial growth under a condition where the n-type impurity (for example, N (nitrogen)) is introduced into the epitaxial layer in a relatively large amount, and then the n-type epitaxial layer 5 is formed by performing the epitaxial growth under a condition where the n-type impurity (for example, N (nitrogen)) is introduced into the epitaxial layer in a relatively small amount. The base plane dislocation (defect) is formed at the interface between the n-type semiconductor substrate 3 and the buffer layer 27.

The depletion layer has a property of being more difficult to stretch as the impurity concentration in the epitaxial layer increases. Thus, by forming the buffer layer 27 having a concentration higher than that of the n-type epitaxial layer 5, the depletion layer extending from the p-type diffusion layer 6 can be prevented from reaching the interface between the n-type semiconductor substrate 3 and the buffer layer 27. Therefore, the growth of the base plane dislocation into the epitaxial layer can be suppressed more effectively.

It is difficult to prevent the depletion layer from being enlarged by increasing the impurity concentration of the n-type epitaxial layer 5 in the same manner as the buffer layer 27, from the viewpoint of preventing the threshold voltage of the pMOS 2 from increasing to a negative value side. Even when the impurity concentration of the n-type epitaxial layer 5 cannot be increased as described above, the growth of the base plane dislocation can be effectively suppressed according to the structure of the present embodiment.

Third Embodiment

FIG. 13 is a cross-sectional view of a semiconductor device according to a third embodiment. The semiconductor device of the present embodiment has a structure in which the depletion layer does not reach the interface between the SiC substrate and the epitaxial layer as in the first embodiment, and has a configuration as described below. That is, as shown in FIG. 13, a distance L1 from a center of the p-type diffusion layer 6 to the n$^+$-type contact layer 17 in the horizontal direction is shorter than the distance d1 from the implantation depth (lower surface) of the p-type diffusion layer 6 to the interface between the n-type epitaxial layer 5 and the n-type semiconductor substrate 3. With the configuration described above, the same effect as that of the first embodiment can be obtained, and a latch-up operation of the CMOS in a high temperature environment can be suppressed. Here, the horizontal direction refers to a direction along the main surface of the n-type semiconductor substrate 3, that is, a lateral direction.

Here, the latch-up operation will be described using FIG. 27 showing a semiconductor device of a comparative example. FIG. 27 is a cross-sectional view showing the semiconductor device according to the comparative example. The structure of the CMOS shown in FIG. 27 is the same as the structure of the CMOS shown in FIG. 26. A bipolar transistor is parasitic in a CMOS which is not isolated by an insulating film such as shallow trench isolation (STI). For example, the CMOS shown in FIG. 27 has an npn transistor structure, which is a parasitic transistor, including the $n^+$-type source region 7 as an emitter, the p-type diffusion layer 6 as a base, and the n-type epitaxial layer 5 as a collector. Similarly, a pnp transistor having the $p^+$-type drain region 16 as an emitter, the n-type epitaxial layer 5 as abase, and the p-type diffusion layer 6 as a collector is also parasitic. When the product of current amplification factors of the two transistors is larger than 1, latch-up occurs due to the operation of a parasitic thyristor, and a large current flows.

A current flowing through a resistor 60 of the p-type diffusion layer 6 sandwiched between the $n^+$-type source region 7 and the n-type epitaxial layer 5 may start with erroneous ignition of the parasitic npn transistor, and when the generated voltage drop is larger than the built-in voltage, the parasitic element (parasitic thyristor) becomes the ON state and becomes uncontrollable. Since the sheet resistance of the p-type diffusion layer 6 in the n-type epitaxial layer 5 particularly made of SiC is 100 k$\Omega$/□ to 300 k$\Omega$/□ and is relatively high, it is required to suppress the latch-up operation by reducing the current flowing through the resistor 60.

The current flowing through the resistor 60 is made of generation/recombination components generated mainly in the depletion layer, and a current 61 in the vertical direction flowing near the center of the p-type diffusion layer 6 in the lateral direction passes through the resistor 60 in the course of flowing to the $p^+$-type contact layer 9 in the p-type diffusion layer 6. In the case of a high temperature of, particular 700° C. or higher, since a diffusion component is superimposed on the current 61 in the vertical direction in addition to the generation/recombination components increased due to the temperature, it is necessary to prevent the current from flowing to the resistor 60.

In the CMOS shown in FIG. 27, since the back surface electrode 4 and the substrate electrode 19 of the pMOS 2 have the same potential, the leakage current is divided into the current 61 in the vertical direction and a current 62 in the horizontal direction. The current 61 in the vertical direction sequentially passes through the n-type epitaxial layer 5, the p-type diffusion layer 6, and the $p^+$-type contact layer 9 from the vicinity of the interface between the n-type epitaxial layer 5 and the n-type semiconductor substrate 3 to the substrate electrode 11, and the current 62 in the horizontal direction sequentially passes through the n-type epitaxial layer 5, the p-type diffusion layer 6 and the $p^+$-type contact layer 9 from the $n^+$-type contact layer 17 to the substrate electrode 11.

In the present embodiment, by making the distance d1 shown in FIG. 13 sufficiently larger than the distance L1, the current 62 flowing in the lateral direction increases, but the current 61 flowing in the vertical direction is reduced, thereby suppressing the erroneous ignition of a parasitic bipolar. The distance d1 is the shortest distance from the p-type diffusion layer 6 in the vertical direction to the interface between the n-type epitaxial layer 5 and the n-type semiconductor substrate 3. The distance L1 is the shortest distance from the center of the $p^+$-type contact layer 9 to the $n^+$-type contact layer 17 in the horizontal direction. In other words, the distance L1 is a distance from the center of the $p^+$-type contact layer 9 to the $n^+$-type contact layer 17 in a direction where the nMOS 1 and the pMOS 2 are adjacent to each other.

FIG. 14 is a graph showing a relationship between a ratio of the distance L1 to the distance d1 and the temperature of the n-type semiconductor substrate 3 (see FIG. 13). That is, FIG. 14 is a graph showing the relationship between the presence or absence of the latch-up and the structure and temperature of the CMOS. The graph shown in FIG. 14 shows results of calculating the relationship between the ratio of the distance L1 to the distance d1 and the temperature, assuming that the sheet resistance Rs of the p-type diffusion layer 6 is constant at 200 k$\Omega$/□. In FIG. 14, the graph shows the relationship between the ratio of the distance L1 to the distance d1 and the temperature at the boundary both when the latch-up occurs and when the latch-up does not occur. That is, in FIG. 14, the latch-up does not occur under the condition on the left side of the graph represented by the solid line, while the latch-up occurs under the condition on the right side of the graph.

As shown in FIG. 14, when the temperature of the n-type semiconductor substrate 3 is higher than 800° C., it is necessary to increase the distance d1 with respect to the distance L1 in order to prevent the latch-up. In addition, when the CMOS is operated at, for example, 850° C., the latch-up can be prevented by setting L1/d1 to 0.2 or less.

Here, FIG. 15 is the plan view of the semiconductor device of the present embodiment. In FIG. 15, the illustration of the gate insulating film and the interlayer insulating film is omitted. As shown in FIG. 15, the nMOS 1 and the pMOS 2 share a gate wiring 23. That is, the same voltage is applied to the gate electrodes 14 and 20 (see FIG. 13). In addition, in the plan view, the $n^+$-type source region 7 and the $n^+$-type drain region 8 are surrounded by the $p^+$-type contact layer 9. In addition, in the plan view, the $p^+$-type source region 15 and the $p^+$-type drain region 16 are surrounded by the $n^+$-type contact layer 17.

Connection portions (contact plugs) 22 are connected to the $n^+$-type source region 7, the $n^+$-type drain region 8, the $p^+$-type contact layer 9, the $p^+$-type source region 15, the $p^+$-type drain region 16, and the $n^+$-type contact layer 17 in an ohmic manner. The connection portion 22 corresponds to a part of one of the source electrode 10, the substrate electrode 11, the output electrode 12, the source electrode 18, and the substrate electrode 19 (see FIG. 13). A wiring 25 is electrically connected to the $n^+$-type source region 7 and the $p^+$-type contact layer 9 via the connection portion 22. In addition, the wiring 24 is electrically connected to the $p^+$-type source region 15 and the $n^+$-type contact layer 17 via the connection portion 22. In addition, a wiring 26 is electrically connected to the $n^+$-type drain region 8 and the $p^+$-type drain region 16 via the connection portion 22.

The nMOS 1 and the pMOS 2 sharing the gate wiring 23 have the same gate width direction, and are arranged adjacent to each other in the gate width direction. From the viewpoint of suppressing the latch-up operation, it is desirable that each of the $p^+$-type contact layer 9 and the $n^+$-type contact layer 17 has a layout surrounding the source drain region in the plan view. Since the current 62 in the lateral direction shown in FIG. 27 flows from the $n^+$-type contact layer 17 to the $p^+$-type contact layer 9, the current 62 can be easily prevented from flowing around the resistor 60 shown in FIG. 27 by adopting the above layout. Therefore, the latch-up operation can be further suppressed.

Fourth Embodiment

FIG. 16 shows a cross-sectional view of a semiconductor device according to a fourth embodiment. The structure shown in FIG. 16 has a structure in which the depletion layer does not reach the interface between the SiC substrate and the epitaxial layer as in the first embodiment, and is characterized in that a gate length L2 of the nMOS 1 is shorter than a gate length L3 of the pMOS 2. With the configuration described above, the same effect as that of the first embodiment can be obtained, and the chip area can be reduced while maintaining the function of the CMOS. Therefore, it is possible to improve the performance due to the miniaturization of the semiconductor device and to reduce the cost in the manufacturing process of the semiconductor device.

Details will be described below. Since a fixed charge in the oxide film of SiC is larger than a fixed charge in the oxide film of Si, the threshold voltage of the pMOS 2 on the SiC substrate tends to increase to the negative value side. The pMOS 2 is an element for switching on/off by applying a negative bias to the gate electrode 20, and when the threshold voltage increases to the negative value side, there is a problem that the negative voltage applied to the gate electrode 20 also increases. That is, in the pMOS 2 using SiC as a material, an absolute value of the threshold voltage is likely to increase, and the impurity concentration of the n-type epitaxial layer 5 (for example, $5\times10^{14}$ cm$^{-3}$ to $2\times10^{16}$ cm$^{-3}$) may be kept low in order to prevent such an increase.

When the impurity concentration (epitaxial concentration) of the n-type epitaxial layer 5 is low, the depletion layer extending from the p$^+$-type drain region 16 is easy to connect to the p$^+$-type source region 15 due to the potential difference between the p$^+$-type drain region 16 and the p$^+$-type source region 15 (referred to as "punch-through"). Since the punch-through deprives a function as a switching element, it is necessary to set the gate length L3 of the pMOS 2 under a condition where the punch-through does not occur. That is, it is necessary to ensure a relatively large gate length L3 of the pMOS 2. The gate length L3 of the pMOS 2 refers to a distance between the p$^+$-type drain region 16 and the p$^+$-type source region 15 in a short dimension direction of the gate electrode 20 along the horizontal direction. In addition, the gate length L2 of the nMOS 1 refers to a distance between the n$^+$-type drain region 8 and the n$^+$-type source region 7 in the short dimension direction of the gate electrode 14 along the horizontal direction.

On the other hand, in the nMOS 1, the impurity concentration of the p-type diffusion layer 6 is 10 to 1000 times larger than the impurity concentration of the n-type epitaxial layer 5, which is a channel region of the pMOS 2, and the punch-through is less likely to occur. Therefore, it is possible to shorten the gate length L2 of the nMOS 1 with respect to the gate length L3 of the pMOS 2. Accordingly, the size of the semiconductor chip can be reduced. That is, it is possible to improve the performance due to the miniaturization of the semiconductor device and to reduce the cost in the manufacturing process of the semiconductor device.

Fifth Embodiment

The semiconductor device of a fifth embodiment has a structure in which the depletion layer does not reach the interface between the SiC substrate and the epitaxial layer as in the first embodiment, and is characterized in that a part or all of the using temperature of the semiconductor device is 350° C. or higher. FIG. 17 shows an example of a drive temperature sequence according to the invention. FIG. 17 is a graph showing a relationship between the use time of the semiconductor device of the present embodiment and the temperature of the semiconductor device.

The present inventors have found that when the semiconductor device described in the first embodiment is used in a high temperature environment of 350° C. or higher, the growth of the Shockley type stacking defect spreading with the growth of the base plane dislocation can be suppressed, and the Shockley type stacking defect may recover. That is, the growth of the Shockley type stacking defect can be prevented even when the temperature of the use environment of the semiconductor device is 200° C. or higher, when the temperature of the n-type semiconductor substrate 3 is 350° C. or higher while the semiconductor device is used.

In the present embodiment, the same effect as the first embodiment can be obtained. Further, as shown in FIG. 17, by setting at least a part of the drive temperature of the semiconductor device to 350° C., it is possible to suppress the growth of a Shockley type stacking defect spreading with the growth of the base plane dislocation. Therefore, the reliability of the semiconductor device can be improved.

Sixth Embodiment

FIG. 18 is a cross-sectional view of the semiconductor device according to the sixth embodiment. The semiconductor device of the present embodiment has a structure in which the depletion layer does not reach the interface between the SiC substrate and the epitaxial layer as in the first embodiment, and is characterized in that the threshold voltage of the nMOS is controlled by a three-terminal regulator.

As shown in FIG. 18, the semiconductor device of the present embodiment has the same structure as the semiconductor device described in the first embodiment. In the semiconductor device of the present embodiment, the source electrode 10 and the substrate electrode 11 are electrically connected via a three-terminal regulator 28, and the threshold voltage of the nMOS 1 is controlled by the three-terminal regulator 28.

The three-terminal regulator 28 is a device serving as transformer for outputting an arbitrary voltage, and is mounted on the semiconductor chip on which the nMOS 1 is formed. In addition, the three-terminal regulator 28 is connected to a bus line 40. Here, controlling of increasing or reducing the potential difference between the source electrode 10 and the substrate electrode 11 can be performed by using the three-terminal regulator 28, and thereby the threshold voltage of the nMOS 1 can be controlled.

In the semiconductor device of the present embodiment, the same effect as the first embodiment can be obtained. Further, the threshold voltage of the nMOS 1 which decreases due to the temperature rise can be compensated by a back bias effect. Therefore, it is possible to drive the device without making a normally-on operation even under a high temperature environment. Since the nMOS, particularly made of SiC, has a large interface charge density, the threshold voltage at a room temperature is as low as about 0.5 V to 2 V, and is likely to be turned normally on with the increase of the temperature. Here, by inputting a voltage lower than that of the source electrode 10 to the substrate electrode 11 shown in FIG. 18, the threshold voltage of the nMOS 1 can be increased (controlled).

Although there is description of the nMOS 1 in FIG. 18, it is needless to say that the threshold voltage can be similarly controlled by connecting the three-terminal regulator 28 between the source electrode and the substrate electrode of the pMOS 2.

Seventh Embodiment

FIG. 19 to FIG. 23 show a semiconductor device according to a seventh embodiment. FIG. 19 and FIG. 23 are cross-sectional views showing the semiconductor device according to the present embodiment, and FIG. 20 and FIG. 22 are plan views showing the semiconductor device according to the present embodiment. FIG. 21 is a plan view showing a semiconductor device according to a modification of the present embodiment. FIG. 20, FIG. 21, and FIG. 22 show planar layouts of an entire SiC chip 32. FIG. 23 is a cross-sectional view along a line A-A of FIG. 22.

The semiconductor device of the present embodiment has a structure in which the depletion layer does not reach the interface between the SiC substrate and the epitaxial layer as in the first embodiment, and is characterized in that the back electrode 4 and a wiring pattern 30 of a ceramic package are connected via a sintered bonding material layer 31. By adopting the above embodiment, it is possible to operate the CMOS using SiC as a material at a high temperature of 200° C. or higher.

As shown in FIG. 19, the structure of the back electrode and the structure above the back electrode 4 of the semiconductor device of the present embodiment are the same as the semiconductor device described in the first embodiment. In the semiconductor device of the present embodiment, a semiconductor chip (SiC chip 32) on which the CMOS described in the first embodiment is mounted is bonded onto the wiring pattern 30 of the ceramic package via the sintered bonding material layer 31.

A sintered bonding material constituting the sintered bonding material layer 31 is mainly Ag (silver) or Cu (copper), and when the bonding is performed using the sintered bonding material layer 31, it is necessary to apply a pressure of 1 MPa or less during the bonding. When such a pressure is applied to the CMOS, a fine pattern included in the CMOS may be destroyed. Therefore, in order to avoid such a destruction, as shown in FIG. 20, a pressure contact region 33 for pressing the SiC chip 32 during the bonding is provided separately from a region 34 in which the CMOS is formed. That is, during the bonding, a pressure of, for example, 1 MPa is applied to the pressure contact region 33 instead of the region 34. Accordingly, the reliability of the semiconductor device can be improved.

In the plan view, when the pressure contact region 33 is arranged in an island shape at a plurality of positions of the SiC chip 32, it is necessary to form the pressure contact region 33 in at least three positions with the surfaces thereof exposed. In this case, the pressure contact regions 33 are preferably provided on an outer peripheral part of the SiC chip 32.

Here, FIG. 21 shows a modification of the planar layout of the SiC chip 32 of the present embodiment. As shown in FIG. 21, the pressure contact region 33 may be provided in the whole region sandwiched between the terminal end part of the outer periphery of the SiC chip 32 and the CMOS region 34. Accordingly, it is possible to prevent the fine pattern from being destroyed due to the pressure applied to the CMOS region 34 during the bonding.

FIG. 22 and FIG. 23 show, as an example of the present embodiment, a semiconductor device in which the n-type semiconductor substrate is employed as a substrate. When the CMOS made of SiC is manufactured on the n-type semiconductor substrate, the end part of the substrate has a voltage higher than that of the central part in the plan view, so that it is desirable to cover the end part with a passivation film 35. In FIG. 22, the illustration of a support substrate 37 of the ceramic package shown in FIG. 23 is omitted. In addition, in FIG. 22, hatching is attached to the passivation film 35 for easy understanding of the drawings.

The end part of the SiC chip 32 is covered with the passivation film 35, and in FIG. 22, the outline (end part) of the SiC chip 32 covered with the passivation film 35 is shown by a solid line passing therethrough. In addition, in FIG. 22 and FIG. 23, the outline of a low voltage region 36 is shown by a broken line. As shown in FIG. 23, the SiC chip 32 is bonded onto the wiring pattern 30 of the ceramic package via the sintered bonding material layer 31. The back electrode 4 on the bottom part of the SiC chip 32 is in contact with an upper surface of the sintered bonding material layer 31. The SiC chip 32 includes a high electric field region 38 at an end part of an upper part thereof, and includes the low voltage region 36 at a position closer to the center than the end part of the upper part. The wiring pattern 30 and the passivation film 35 of the ceramic package are disposed on the support substrate 37 of the ceramic package.

The wiring pattern 30 of the ceramic package is larger in width than a stacked structure of the sintered bonding material layer 31 and the SiC chip 32. The passivation film 35 covers an end part of the wiring pattern 30 of the ceramic package and an end part of the stacked structure of the sintered bonding material layer 31 and the SiC chip 32, and the central portion of the low voltage region 36 is exposed from the passivation film 35. That is, the passivation film 35 continuously covers a side surface and an upper surface of the end part of the wiring pattern 30 of the ceramic package, side surfaces of the sintered bonding material layer 31, the back electrode 4, and the SiC chip 32, and an upper surface of the end part of the low voltage region 36.

As described above, by covering the end part of the SiC chip 32 with the passivation film 35, it is possible to suppress the occurrence of discharge at the end part of the SiC chip 32. Therefore, the reliability of the semiconductor device can be improved.

As shown in FIG. 23, the passivation film 35 continuously covers the low voltage region 36 and the high electric field region 38 of the SiC chip 32. Accordingly, the discharge caused by the high electric field region 38 can be prevented between the low voltage region 36 and the end part of the SiC chip 32.

Eighth Embodiment

FIG. 24 is a schematic circuit diagram of a sensor (electrical sensor system) according to an eighth embodiment. The sensor of the present embodiment includes a plurality of system units 200 which amplify a detection signal 202 emitted from a target system 201 and output the amplified detection signal 202 as a digital signal, and the plurality of system units 200 are connected in parallel to each other. In addition, the sensor includes a microcomputer 206 which processes a signal output from the plurality of system units 200, and a control device 207 which controls the target system 201 by a feedback signal output from the microcomputer 206.

Each system unit 200 includes a sensor circuit 203 which converts the detection signal 202 emitted from the target system 201 into an electrical signal, an amplifier circuit 204 which amplifies an electrical signal of the sensor circuit 203, and an ADC circuit 205 which converts an analog signal from the amplifier circuit 204 into a digital signal. The digital signal output from the ADC circuit 205 is input to the microcomputer 206. In this way, at least the sensor circuit 203 and the amplifier circuit 204 are mounted on the same package.

The detection signal 202 emitted from the target system 201 includes, for example, a signal detected from a $NO_x$ amount sensor, a hydrogen sensor, or a water level sensor of cooling water. The microcomputer 206 is a device formed of, for example, a semiconductor element mounted on a Si substrate instead of a SiC substrate, that is, a Si device.

In the sensor, at least the sensor circuit 203 and the amplifier circuit 204 are exposed to a high temperature of 200° C. or higher. Here, as an example, each of the plurality of system units 200 including the target system 201, the sensor circuit 203, the amplifier circuit 204, and the analog to digital converter (ADC) circuit 205 is exposed to a high temperature of 200° C. to 400° C. In the figure, a device exposed to a high temperature of 200° C. is surrounded by a one-dot chain line. In addition, the sensor of the present embodiment is characterized in that the semiconductor device described in any one of the first to seventh embodiments is used in any circuit constituting the sensor circuit 203 and the amplifier circuit 204.

The sensor circuit 203 includes a transistor 211 as a switching element, and a resistance element 210 connected to a drain electrode of the transistor 211, and the detection signal 202 is input to a gate electrode of the transistor 211. The signal output from the drain electrode of the transistor 211 is input to an operational amplifier (OP amp) 212 constituting the amplifier circuit 204, and thereby the amplified signal is input to the ADC circuit 205. The CMOS which is the semiconductor device described in any one of the first to seventh embodiments is used, for example, in the operational amplifier 212 or the ADC circuit 205.

In the above sensor, the defect (base plane dislocation) can be prevented from growing in the semiconductor device described in any one of the first to seventh embodiments used in a high temperature environment. Therefore, it is possible to prevent the semiconductor device from failing to operate normally due to a characteristic change of the semiconductor element along with the enlargement of the defect. Therefore, since the amplification can be performed without the deterioration of the detection signal sensed in a high temperature environment, the sensing accuracy in a high temperature environment can be improved. That is, the reliability of the sensor can be improved. Further, by improving the heat resistance of the ADC circuit 205 and enabling the use of the ADC circuit 205 at a high temperature, it is possible to use a low-cost cable for digital signal transmission, so that the cost of the system can be reduced.

In the present embodiment, the MOSFET is used as the sensor, but the same effect can be obtained by using a diode, a bipolar transistor or the like. Although a DAC circuit which converts a digital signal into an analog signal is not specified between the ADC circuit 205 and the microcomputer 206, it is needless to say that the DAC circuit can be set as necessary.

In addition, although the present embodiment focuses on the temperature, the same effect can be obtained even when the sensor circuit 203 and the amplifier circuit 204 are used in a high radiation environment. That is, here, the sensor circuit 203 and the amplifier circuit 204 in which the semiconductor device described in any one of the first to seventh embodiments is used are set in a use environment where a cumulative dose of the radiation is 0.1 kGy or more. In this case, a hydrogen sensor or the like is used for the sensor, and a sensor using the semiconductor device according to any one of claims 1 to 7 is set in a radiation environment of 0.1 kGy or more, which is difficult to operate in the Si device, and thereby it is possible to ensure the sensing accuracy and the stability.

Ninth Embodiment

FIG. 25 is a schematic circuit diagram of a sensor (electrical sensor system) according to a ninth embodiment. The sensor of the present embodiment has the same configuration as the eighth embodiment, and is characterized in that the microcomputer 206 is used in a low temperature environment of lower than 200° C., and the semiconductor device using Si as a material is used in the microcomputer 206. In the above sensor, it is possible to process the information of the system units 200 provided in parallel at a high speed. In the figure, the device used in an environment of 200° C. or higher is surrounded by a one-dot chain line, and the device used in an environment of lower than 200° C. is surrounded by a two-dot chain line.

The CMOS formed on the SiC substrate has channel mobility lower than that of the CMOS formed on the Si substrate, and is an unfit device for a high-speed operation and a high-speed processing of information. Therefore, the microcomputer 206 using Si as a material is applied to information processing, and is used in an environment adjusted to a temperature at which Si can operate. That is, by setting the microcomputer 206 at a place away from the sensor circuit 203 or the like exposed to the high temperature, it is possible to ensure the high-speed processing performance and the reliability of the microcomputer 206 in which the semiconductor element formed on the Si substrate (silicon substrate) is used.

In addition, although the present embodiment focuses on the temperature, the same effect can be obtained with the same configuration even in a high radiation environment. That is, here, the microcomputer 206 in which the Si device is used is set in a use environment where the cumulative dose of the radiation is less than 0.1 kGy. In this way, by installing the microcomputer 206 in a low radiation environment (for example, a radiation environment of less than 0.1 kGy), the microcomputer 206 can process the information of the system units 200 connected in parallel at a high speed.

While the invention made by the present inventors has been concretely explained with reference to the embodiments, the invention is not limited to the above embodiments, and various changes and modifications may be made without departing from the scope of the invention.

For example, although it is the described that n-type SiC substrate and the n-type epitaxial layer are used in the first to ninth embodiments, a p-type SiC substrate and a p-type epitaxial layer may also be used. In this case, instead of the p-type diffusion layer 6 (see FIG. 1), an n-type diffusion layer is formed on the upper surface of the epitaxial layer, and a depletion layer generated below the n-type diffusion layer during the operation of the pMOS formed on the upper part of the n-type diffusion layer is achieved with a structure which does not reach the interface between the epitaxial layer and the SiC substrate. Therefore, it is possible to obtain the same effect as those of the first to ninth embodiments.

INDUSTRIAL APPLICABILITY

The invention can be widely used for a semiconductor device including a CMOS, a method of manufacturing the same, and a sensor.

REFERENCE SIGN LIST 1 nMOS
2 pMOS
3 n-type semiconductor substrate
5 n-type epitaxial layer
6 p-type diffusion layer
11, 19 substrate electrode 21 depletion layer
d1 distance
d2 thickness

The invention claimed is:

1. A semiconductor device, comprising:
   a semiconductor substrate of a first conductivity type which contains silicon carbide;
   a semiconductor layer of the first conductivity type which contains silicon carbide, is formed on the semiconductor substrate and is in contact with a main surface of the semiconductor substrate;
   a first MOSFET of the first conductivity type which is formed on an upper part of the semiconductor layer; and
   a second MOSFET of a second conductivity type which is formed on the upper part of the semiconductor layer, the second conductivity type being different from the first conductivity type,
   wherein the first MOSFET includes:
      a diffusion layer of the second conductivity type which is formed on an upper surface of the semiconductor layer and reaches an intermediate depth of the semiconductor layer;
      a first source region of the first conductivity type, a first drain region of the first conductivity type, and a first contact layer of the second conductivity type which are formed on an upper surface of the diffusion layer;
      a first gate electrode which is formed on the semiconductor layer between the first source region and the first drain region via a first insulating film; and
      a first electrode which is connected to the first contact layer,
   the second MOSFET includes:
      a second source region of the second conductivity type, a second drain region of the second conductivity type, and a second contact layer of the first conductivity type which are formed on the upper surface of the semiconductor layer;
      a second gate electrode which is formed on the semiconductor layer between the second source region and the second drain region via a second insulating film; and
      a second electrode which is connected to the second contact layer,
   the first MOSFET and the second MOSFET constitute a CMOSFET, and
   a first distance from the diffusion layer to the semiconductor substrate is larger than a thickness of a depletion layer extending from the diffusion layer to the semiconductor substrate in response to a potential difference between a first voltage applied to the second source region and a second voltage applied to the first source region in a direction perpendicular to the main surface of the semiconductor substrate.

2. The semiconductor device according to claim 1, wherein
   a buffer layer of the first conductivity type having an impurity concentration higher than that of the semiconductor layer is interposed between the semiconductor substrate and the semiconductor layer.

3. The semiconductor device according to claim 1, wherein
   the second contact layer is located closer to a diffusion layer side than the second source region and the second drain region, and
   a second distance from a center of the diffusion layer to the second contact layer in a direction where the first MOSFET and the second MOSFET are adjacent to each other is smaller than the first distance.

4. The semiconductor device according to claim 1, wherein
   a gate length of the first MOSFET is smaller than a gate length of the second MOSFET.

5. The semiconductor device according to claim 1, wherein
   the semiconductor substrate has a temperature of 350° C. or higher during use.

6. The semiconductor device according to claim 1, wherein
   the first source region and the first contact layer are electrically connected to each other via a three-terminal regulator, and a threshold voltage of the first MOSFET is controlled by the three-terminal regulator.

7. The semiconductor device according to claim 1, further comprising:
   a third electrode which is electrically connected to the second electrode and covers a back surface on a side opposite to the main surface of the semiconductor substrate;
   a wiring pattern of a ceramic package; and
   a sintered material layer which bonds the wiring pattern of the ceramic package and the third electrode.

8. A sensor comprising:
   a sensor circuit which converts a detection signal emitted from a target system into an electrical signal;
   an amplifier circuit which amplifies the electric signal output from the sensor circuit;
   an ADC circuit which converts an analog signal output from the amplifier circuit into a digital signal;
   a microcomputer which processes a signal output from the ADC circuit; and
   a control device which controls the target system based on a feedback signal output from the microcomputer,
   wherein the sensor circuit or the amplifier circuit uses the semiconductor device according to claim 1 and is exposed to a high temperature of 200° C. or higher during use.

9. The sensor according to claim 8, wherein
   the microcomputer is set in an environment of lower than 200° C., and uses a semiconductor device formed on a silicon substrate.

10. A sensor comprising:
    a sensor circuit which converts a detection signal emitted from a target system into an electrical signal;
    an amplifier circuit which amplifies the electric signal output from the sensor circuit;
    an ADC circuit which converts an analog signal output from the amplifier circuit into a digital signal;
    a microcomputer which processes a signal output from the ADC circuit; and
    a control device which controls the target system based on a feedback signal output from the microcomputer,
    wherein the sensor circuit or the amplifier circuit uses the semiconductor device according to claim 1, and is set in a use environment where a cumulative dose of radiation is equal to or more than 0.1 kGy.

11. The sensor according to claim 10, wherein
    the microcomputer is set in a use environment where the cumulative dose of radiation is less than 0.1 kGy, and uses a semiconductor device formed on a silicon substrate.

12. A method of manufacturing a semiconductor device, the method comprising:
 (a) a step of preparing a semiconductor substrate of a first conductivity type containing silicon carbide;
 (b) a step of forming a semiconductor layer of the first conductivity type on the semiconductor substrate by an epitaxial growth method;
 (c) a step of forming a diffusion layer of a second conductivity type different from the first conductivity type, and a first source region of the first conductivity type, a first drain region of the first conductivity type and a first contact layer of the second conductivity type, which are disposed on an upper surface of the diffusion layer, in a first region on an upper surface of the semiconductor layer, and forming a second source region of the second conductivity type, a second drain region of the second conductivity type, and a second contact layer of the first conductivity type in a second region of the upper surface of the semiconductor layer;
 (d) a step of forming a first gate electrode on the semiconductor layer between the first source region and the first drain region via a first insulating film, and forming a second gate electrode on the semiconductor layer between the second source region and the second drain region via a second insulating film; and
 (e) after the step (d), a step of forming a first electrode connected to the first contact layer on the semiconductor layer, and forming a second electrode connected to the second contact layer on the semiconductor layer, wherein the diffusion layer, the first source region, the first drain region, the first contact layer, the first gate electrode, and the first electrode constitute a first MOSFET, the second source region, the second drain region, the second contact layer, the second gate electrode, and the second electrode constitute a second MOSFET, the first MOSFET and the second MOSFET constitute a CMOSFET, and a first distance from the diffusion layer to the semiconductor substrate is larger than a thickness of a depletion layer extending from the diffusion layer to the semiconductor substrate in response to a potential difference between a first voltage applied to the second source region and a second voltage applied to the first source region in the direction perpendicular to a main surface of the semiconductor substrate.

* * * * *